United States Patent
Kim et al.

(10) Patent No.: US 12,469,810 B2
(45) Date of Patent: Nov. 11, 2025

(54) SEMICONDUCTOR PACKAGE

(71) Applicant: Samsung Electronics Co., Ltd., Suwon-si (KR)

(72) Inventors: Seongyo Kim, Asan-si (KR); Un-Byoung Kang, Hwaseong-Si (KR); Minsoo Kim, Gumi-si (KR); Sang-Sick Park, Hwaseong-si (KR); Seungyoon Jung, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 461 days.

(21) Appl. No.: 17/939,127

(22) Filed: Sep. 7, 2022

(65) Prior Publication Data

US 2023/0230946 A1    Jul. 20, 2023

(51) Int. Cl.
*H01L 23/00* (2006.01)
*H01L 25/065* (2023.01)

(52) U.S. Cl.
CPC .............. *H01L 24/09* (2013.01); *H01L 24/08* (2013.01); *H01L 24/16* (2013.01); *H01L 24/17* (2013.01); *H01L 24/32* (2013.01); *H01L 24/73* (2013.01); *H01L 25/0652* (2013.01); *H01L 25/0657* (2013.01); *H01L 24/81* (2013.01); *H01L 2224/0801* (2013.01); *H01L 2224/08055* (2013.01); *H01L 2224/08056* (2013.01);
(Continued)

(58) Field of Classification Search
None
See application file for complete search history.

(56) References Cited

U.S. PATENT DOCUMENTS 9,385,098 B2    7/2016  Zhang et al.
10,109,608 B2   10/2018 Lin et al.
(Continued)

FOREIGN PATENT DOCUMENTS

JP    2006294656 A    10/2006
JP    6467981 B2      2/2019
(Continued)

*Primary Examiner* — Long Pham
(74) *Attorney, Agent, or Firm* — Muir Patent Law, PLLC

(57) ABSTRACT

A semiconductor package comprises a first die having a central region and a peripheral region that surrounds the central region; a plurality of through electrodes that penetrate the first die; a plurality of first pads at a top surface of the first die and coupled to the through electrodes; a second die on the first die; a plurality of second pads at a bottom surface of the second die, the bottom surface of the second die facing the top surface of the first die; a plurality of connection terminals that connect the first pads to the second pads; and a dielectric layer that fills a space between the first die and the second die and surrounds the connection terminals. A first width of each of the first pads in the central region may be greater than a second width of each of the first pads in the peripheral region. Each of the connection terminals may include a convex portion at a lateral surface thereof, which protrudes beyond a lateral surface of a respective first pad and a lateral surface of a respective second pad. The convex portion may protrude in a direction away from a center of the first die. Protruding distances of the convex portions may increase in a direction from the center of the first die toward an outside of the first die.

20 Claims, 16 Drawing Sheets

(52) U.S. Cl.
CPC ............... *H01L 2224/0903* (2013.01); *H01L 2224/09132* (2013.01); *H01L 2224/09179* (2013.01); *H01L 2224/16012* (2013.01); *H01L 2224/16055* (2013.01); *H01L 2224/16059* (2013.01); *H01L 2224/16104* (2013.01); *H01L 2224/16145* (2013.01); *H01L 2224/16227* (2013.01); *H01L 2224/1703* (2013.01); *H01L 2224/17055* (2013.01); *H01L 2224/17104* (2013.01); *H01L 2224/17132* (2013.01); *H01L 2224/17179* (2013.01); *H01L 2224/32145* (2013.01); *H01L 2224/32225* (2013.01); *H01L 2224/73204* (2013.01); *H01L 2224/81203* (2013.01); *H01L 2225/06513* (2013.01); *H01L 2225/06524* (2013.01); *H01L 2225/06527* (2013.01); *H01L 2225/06544* (2013.01); *H01L 2225/06589* (2013.01); *H01L 2924/182* (2013.01); *H01L 2924/3511* (2013.01)

(56) References Cited

U.S. PATENT DOCUMENTS

| | | | |
|---|---|---|---|
| 10,658,300 B2* | 5/2020 | Kim | H01L 23/5386 |
| 12,074,142 B2* | 8/2024 | Hong | H01L 25/0657 |
| 2021/0193581 A1 | 6/2021 | Seo et al. | |
| 2022/0068853 A1* | 3/2022 | Lee | H01L 24/02 |
| 2023/0170304 A1* | 6/2023 | Seo | H01L 23/5385 257/737 |
| 2024/0387420 A1* | 11/2024 | Kwon | H01L 24/13 |

FOREIGN PATENT DOCUMENTS

| | | |
|---|---|---|
| JP | 2019-140179 A | 8/2019 |
| KR | 10-2029484 B1 | 10/2019 |
| KR | 1020210051535 A | 5/2021 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0006089 filed on Jan. 14, 2022 in the Korean Intellectual Property Office, the disclosure of which is hereby incorporated by reference in its entirety.

BACKGROUND

The present inventive concepts relate to a semiconductor package, and more particularly, to a stack-type semiconductor package.

Trends in today's electronics industries are to fabricate lightweight, compact, high speed, multi-functionality, and high performance products at reasonable prices. A multi-chip stacked package technique or a system-in-package technique is used to meet these trends. In relation to a multi-chip stacked package or a system-in-package, one semiconductor package may perform functions of a number of unit semiconductor devices. Although the multi-chip stacked package or the system-in-package may be somewhat thicker than a typical single chip package, they have a planar size similar to that of a single chip package and thus are primarily used for high-end, compact, and portable products such as mobile phones, laptop computers, memory cards, or portable camcorders.

SUMMARY

Some embodiments of the present inventive concepts provide a semiconductor package with increased structural stability and a method of fabricating the same.

Some embodiments of the present inventive concepts provide a semiconductor package with increased efficiency of thermal radiation and a method of fabricating the same.

Some embodiments of the present inventive concepts provide a semiconductor package with improved operating stability and a method of fabricating the same.

The object of the present inventive concepts is not limited to the mentioned above, and other objects which have not been mentioned above will be clearly understood to those skilled in the art from the following description.

According to some embodiments of the present inventive concepts, a semiconductor package comprises: a first die having a central region and a peripheral region that surrounds the central region; a plurality of through electrodes that penetrate the first die; a plurality of first pads at a top surface of the first die and coupled to the through electrodes; a second die on the first die; a plurality of second pads at a bottom surface of the second die, the bottom surface of the second die facing the top surface of the first die; a plurality of connection terminals that connect the first pads to the second pads; and a dielectric layer that fills a space between the first die and the second die and surrounds the connection terminals. A first width of each of the first pads in the central region may be greater than a second width of each of the first pads in the peripheral region. Each of the connection terminals may include a convex portion at a lateral surface thereof, which protrudes beyond a lateral surface of a respective first pad and a lateral surface of a respective second pad. The convex portion may protrude in a direction away from a center of the first die. Protruding distances of the convex portions may increase in a direction from the center of the first die toward an outside of the first die.

According to some embodiments of the present inventive concepts, a semiconductor package comprises: a first die; a plurality of second dies stacked on the first die, each of the second dies including a plurality of first pads, a plurality of second pads, a plurality of third pads, and a plurality of fourth pads, the first pads and the second pads being on a top surface of the respective second die, and the third pads and the fourth pads being on a bottom surface of the respective second die; for each pair of adjacent dies, a plurality of first connection terminals, which connect the first pads of a lower second die of the pair of adjacent second dies to the third pads of an upper second die of the pair of adjacent second dies, the first pads and the third pads vertically overlapping each other between the pair of adjacent second dies; for each pair of adjacent second dies, a plurality of second connection terminals, which connect the second pads of a lower second die of the pair of adjacent second dies to the fourth pads of an upper second die of the pair of adjacent second dies, the second pads and the fourth pads vertically overlapping each other between the pair of adjacent second dies; for each pair of adjacent second dies, a dielectric layer that fills a space between the pair of adjacent second dies; and a plurality of external terminals below the first die and connecting the first die to a substrate. The first and third pads may be in a central region of the second dies. The second and fourth pads may be in a peripheral region of the second dies that is outside of the central region. A first ratio of a maximum width of each first pad in a first horizontal direction to an arrangement period of the first pads in the first horizontal direction may be greater than a second ratio of a maximum width of each second pad in the first horizontal direction to an arrangement period of the second pads in the first horizontal direction.

According to some embodiments of the present inventive concepts, a semiconductor package comprises: a substrate; a plurality of dies stacked on the substrate, each of the dies including a plurality of first pads on a top surface of the die and a plurality of second pads on a bottom surface of the die; a plurality of connection terminals that connect the first pads to the second pads; and a dielectric layer that fills a space between the dies and surrounds the connection terminals. The dies may have a central region and a peripheral region that surrounds the central region. A first area of each of the first pads in the central region may be greater than a second area of each of the first pads in the peripheral region. Each of the connection terminals may include a convex portion on one side of the connection terminal and no convex portion on a second, opposite side of the connection terminal. The one side may be directed toward an outside of the die.

DETAIL DESCRIPTION OF EMBODIMENTS

The following will now describe a semiconductor package according to the present inventive concepts with reference to the accompanying drawings.

Figure 1:
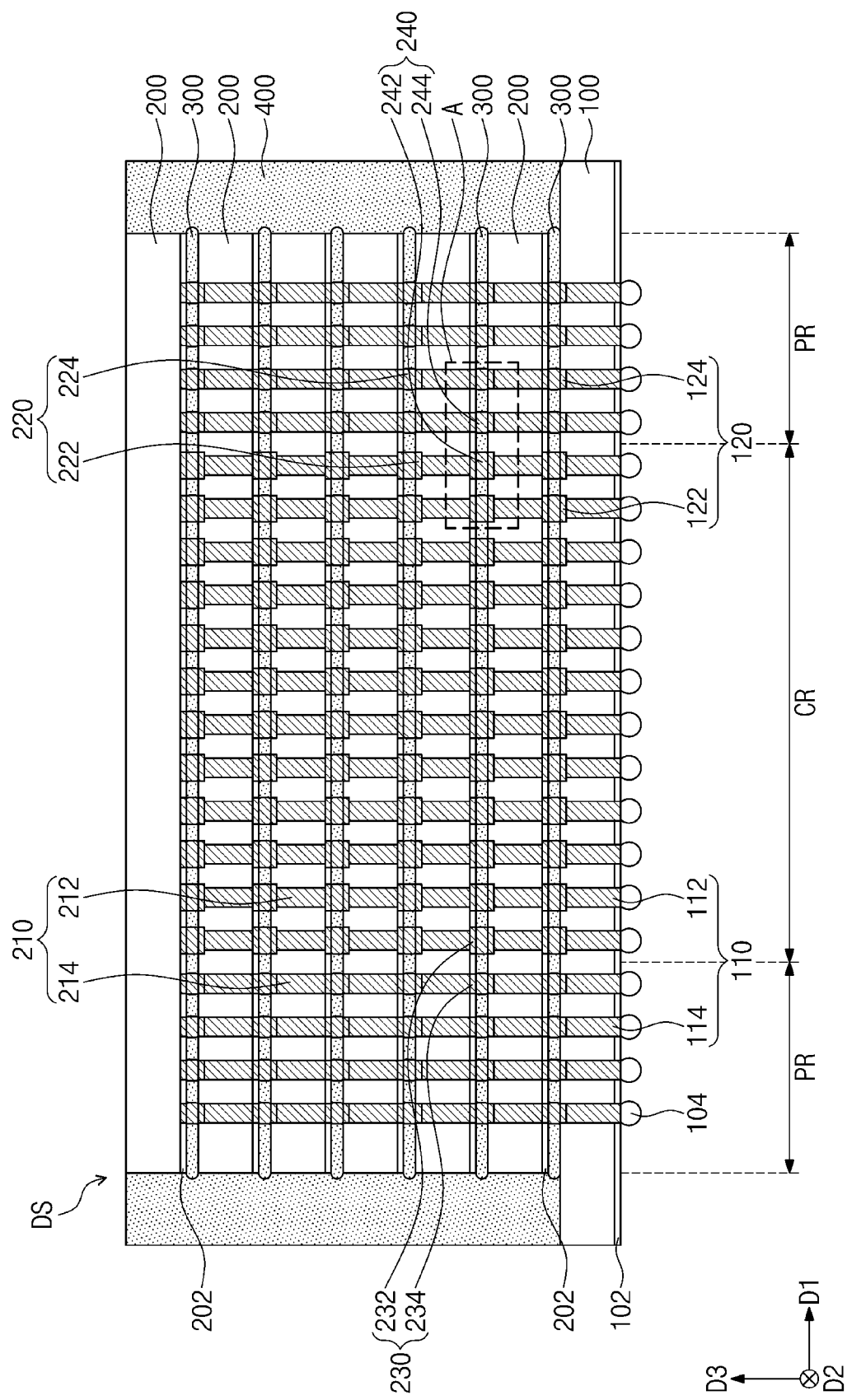
FIG. 1 illustrates a cross-sectional view showing a semiconductor package according to some embodiments of the present inventive concepts.
Figure 2:
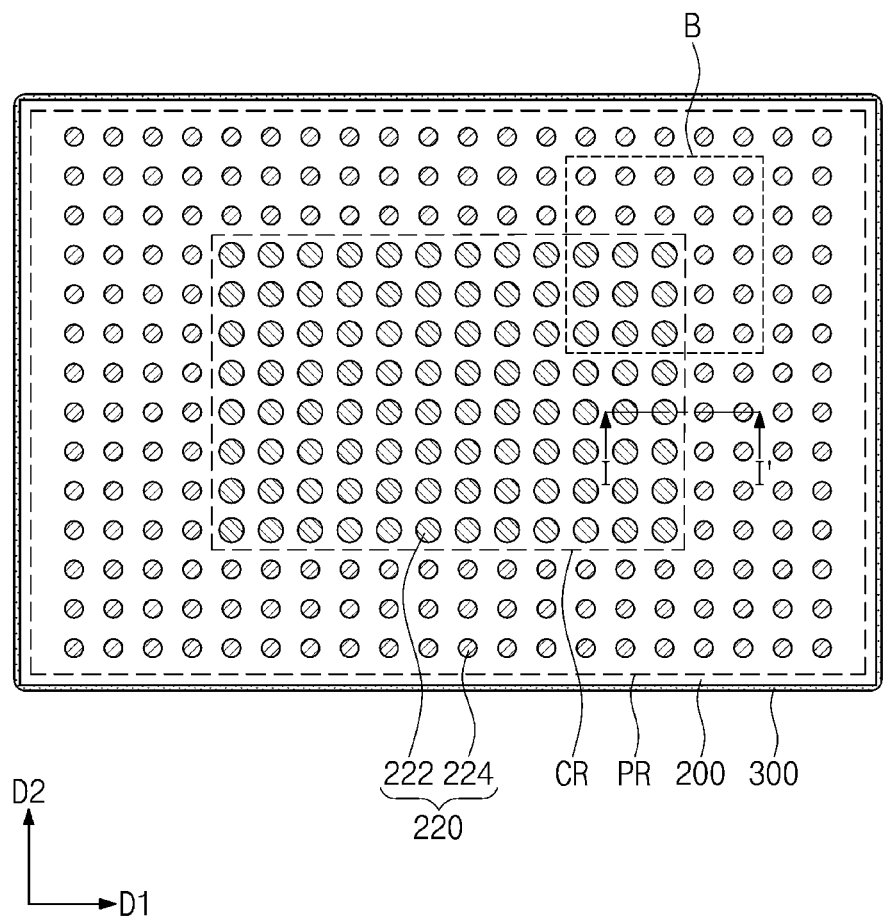
FIG. 2 illustrates a plan view showing a semiconductor package according to some embodiments of the present inventive concepts.
Figure 3:
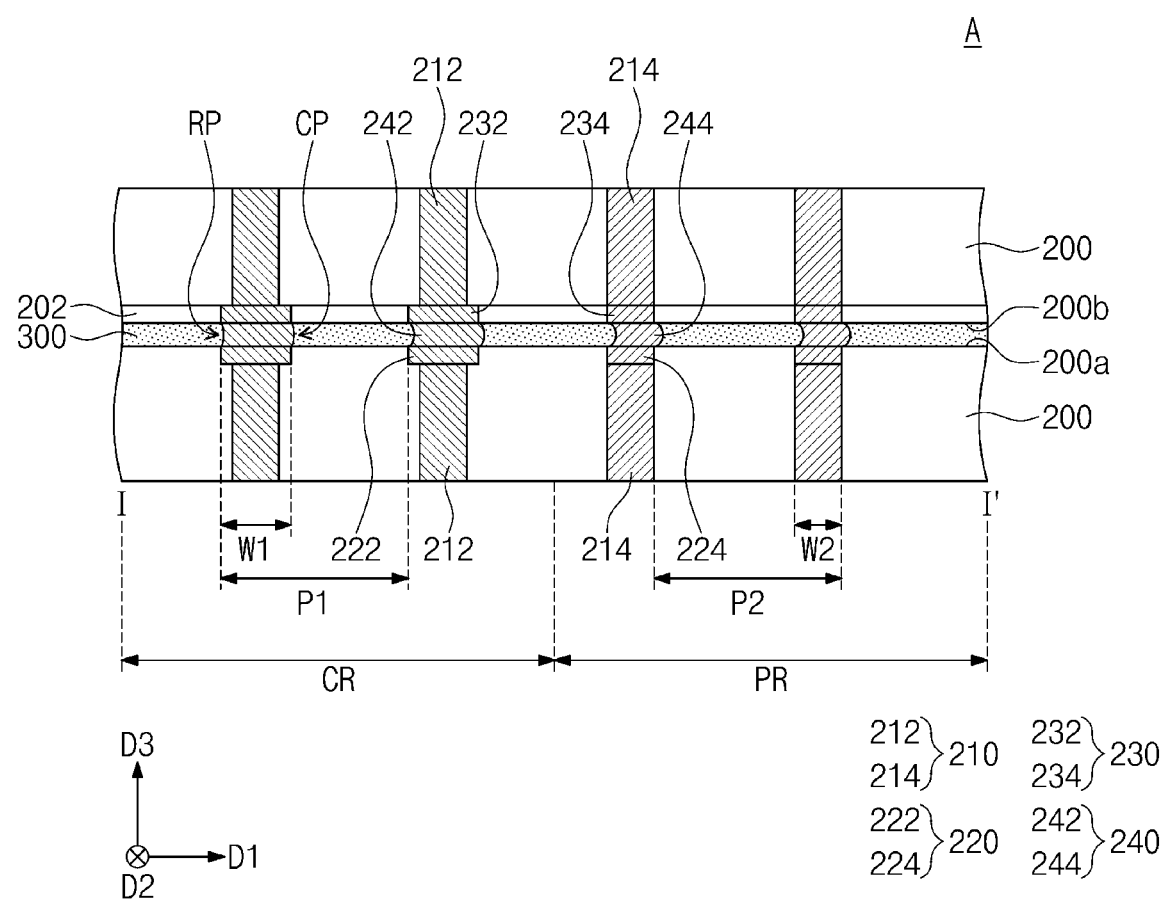
FIG. 3 illustrates an enlarged cross-sectional view taken along line I-I' of FIG. 2, showing section A of FIG. 1.
Figure 4:
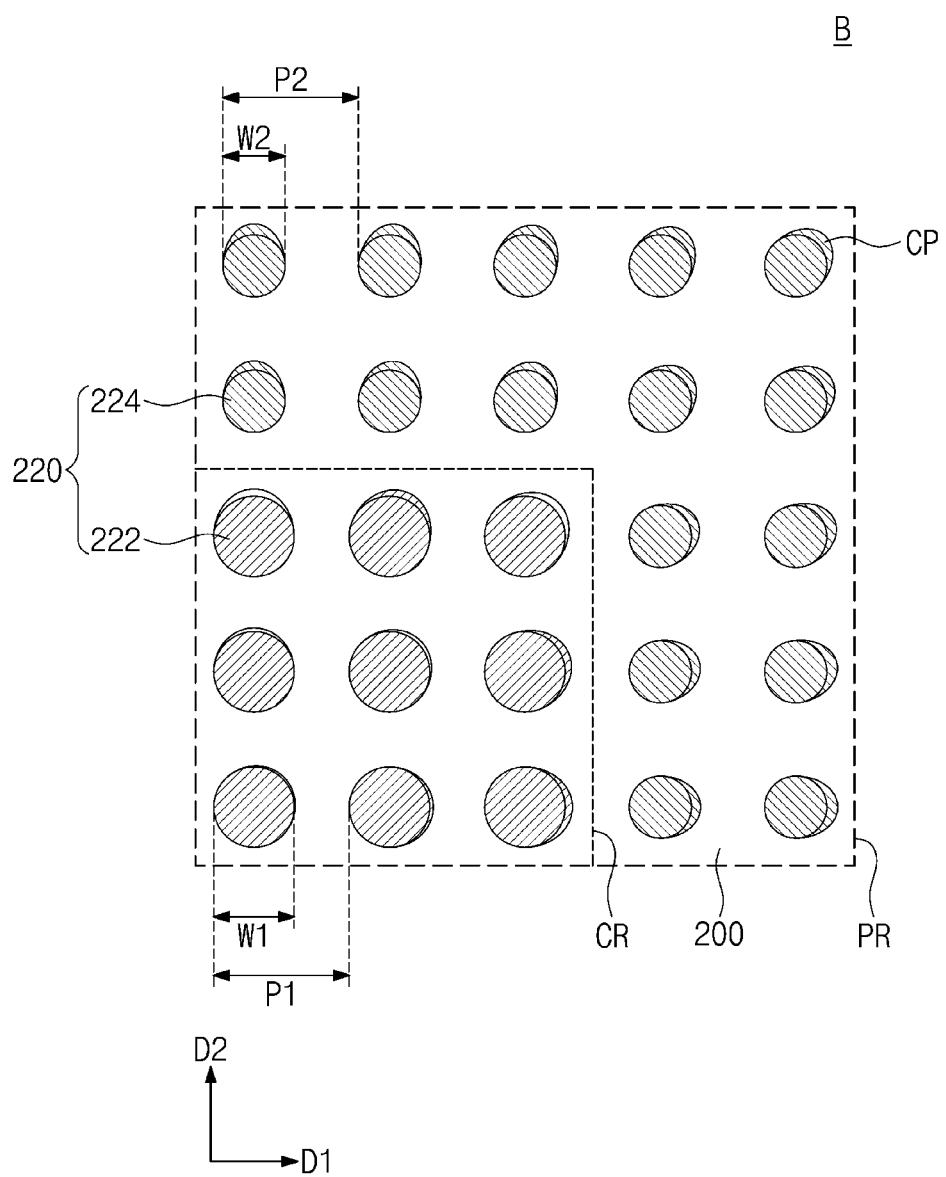
FIG. 4 illustrates an enlarged view showing section B of FIG. 2.
Figure 5:
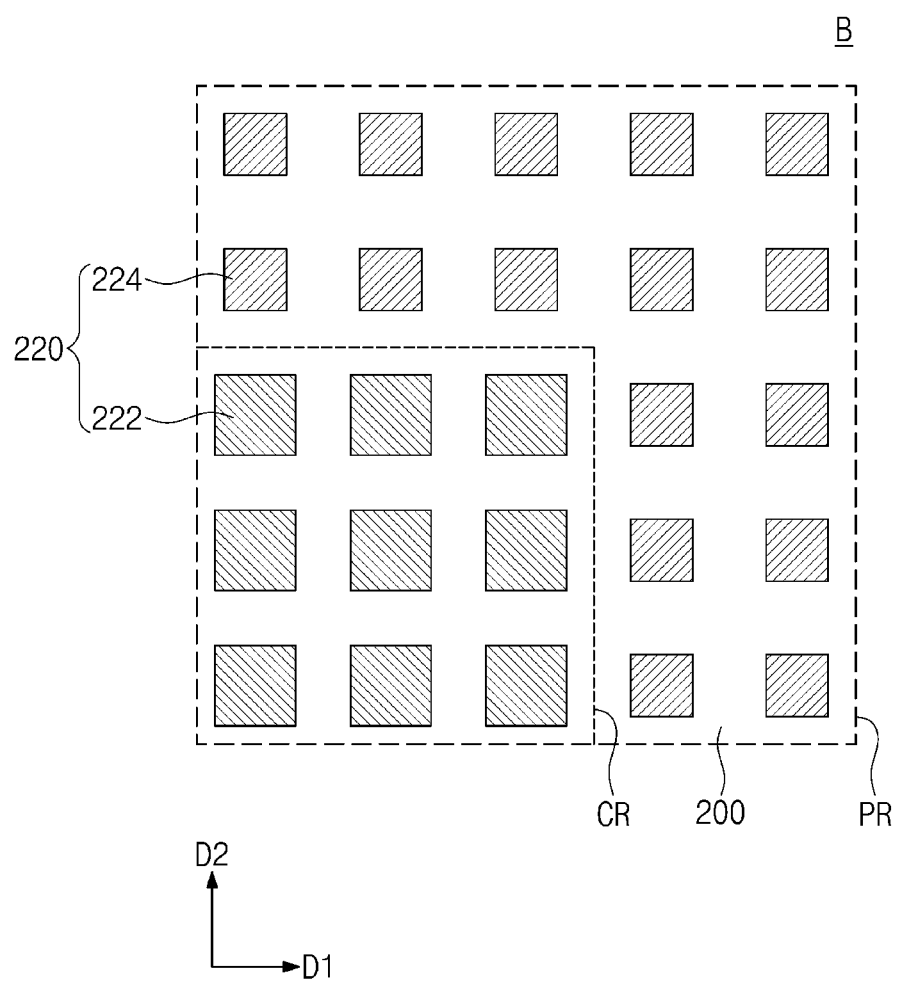
FIGS. 5 to 7 illustrate plan views of section B depicted in FIG. 2, showing shapes of pads.
Figure 6:
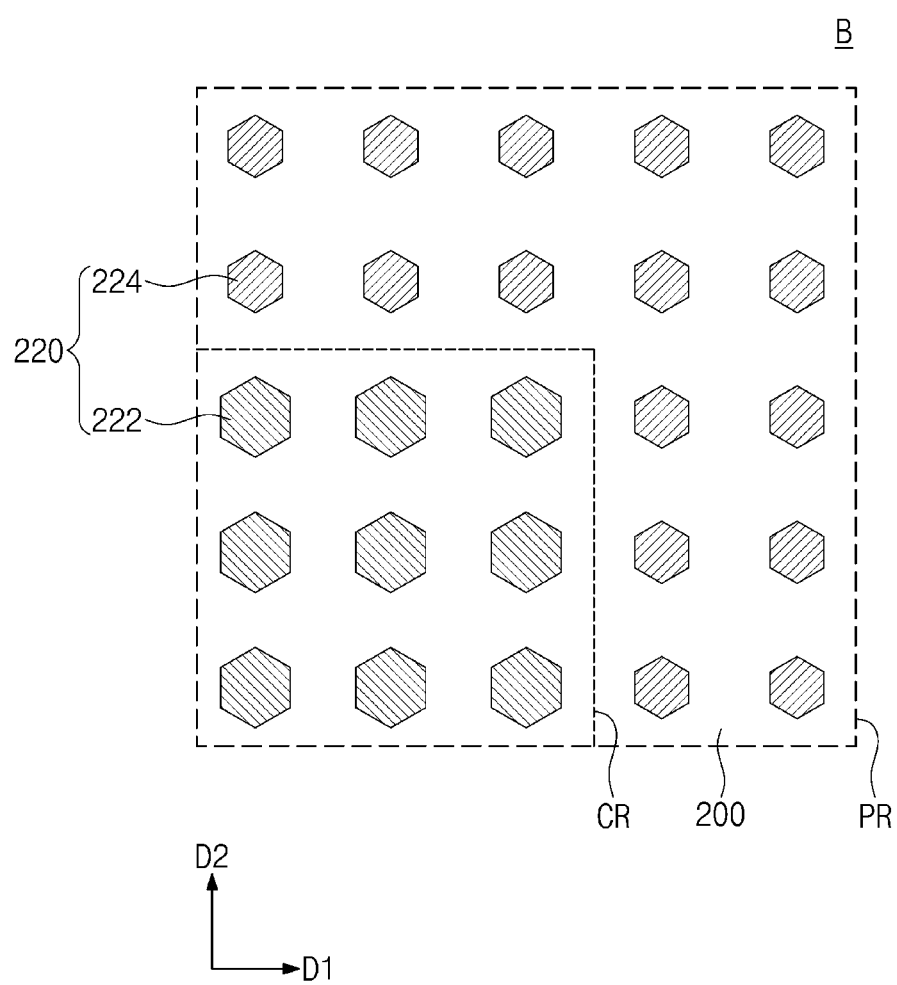
Figure 7:
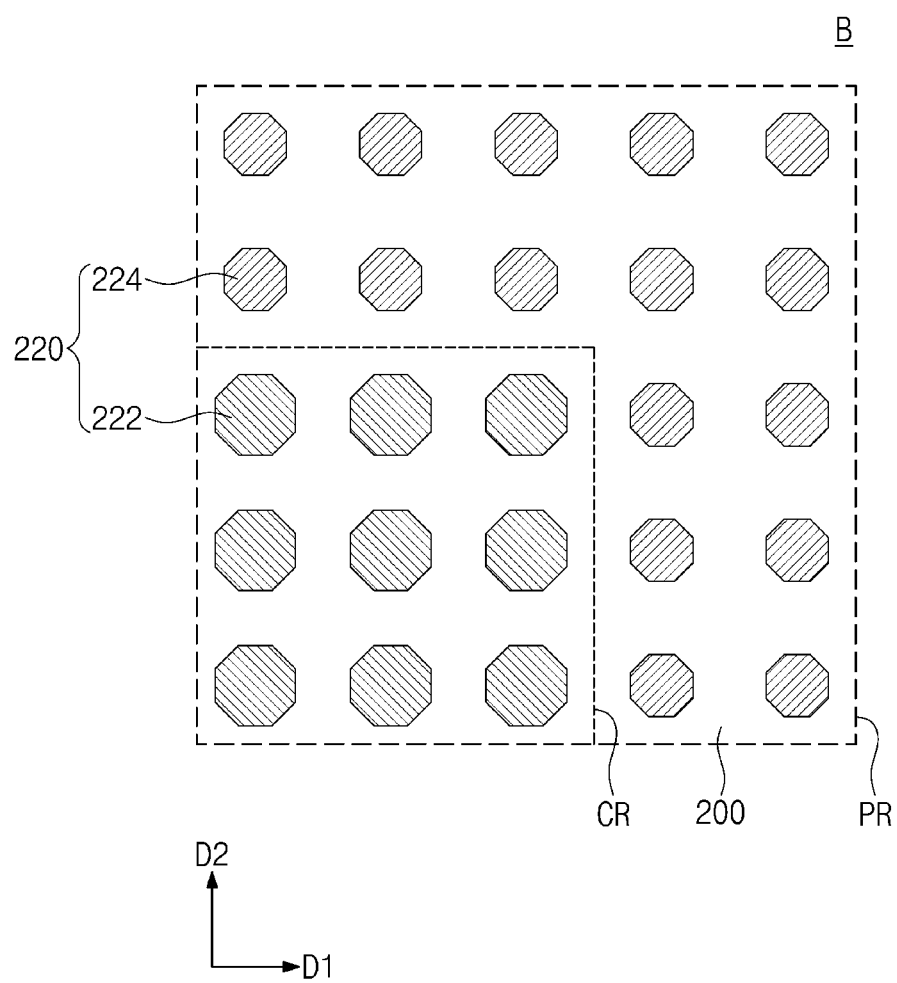

FIG. 1 illustrates a cross-sectional view showing a semiconductor package according to some embodiments of the present inventive concepts. FIG. 2 illustrates a plan view showing a semiconductor package according to some embodiments of the present inventive concepts. FIG. 3 illustrates an enlarged cross-sectional view taken along line I-I' of FIG. 2, showing section A of FIG. 1. FIG. 4 illustrates an enlarged view showing section B of FIG. 2. FIGS. 5 to 7 illustrate plan views of section B depicted in FIG. 2, showing shapes of pads. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Referring to FIGS. 1 to 4, a semiconductor package according to some embodiments of the present inventive concepts may be a stack-type semiconductor package in which one or more vias are used. For example, a base substrate 100 may be provided thereon with second dies 200 of the same type, and the second dies 200 may be electrically connected to each other through fourth vias 210 that are through electrodes that penetrate the second dies 200. The second dies 200 may be coupled to each other through connection terminals 240 that are provided on bottom surfaces 200b of the second dies 200. For example, the second dies 200 may constitute a micro-ball grid array (MBGA) or a micro-pillar grid array (MPGA).

The base substrate 100 may be provided. The base substrate 100 may include an integrated circuit therein. For example, the base substrate 100 may be a first die that includes an electronic element such as a transistor (e.g., it may include a plurality of transistors formed therein). For example, the base substrate 100 may be a wafer-level semiconductor die formed of a semiconductor such as silicon (Si). FIG. 1 shows that the base substrate 100 is a first die, but the present inventive concepts are not limited thereto. According to some embodiments of the present inventive concepts, the base substrate 100 may not include any electronic elements such transistors. The following will discuss an example in which the base substrate 100 and the first die are the same component.

When viewed in plan view, the first die 100 may have a central region CR positioned on a central portion of the first die 100, and may also have a peripheral region PR that surrounds the central region CR (e.g., is outside of the central region CR). The central region CR may be a section on which are provided wiring lines for signals that are processed in an integrated circuit in the first die 100. The central region CR may extend in a first direction D1 and second direction D2, and may extend a longer distance in the first direction D1 than in the second direction D2. The peripheral region PR may be either a section on which are provided wiring lines for various signals (e.g., power signal or ground signal) for driving the integrated circuit in the first die 100 or a section on which are provided one or more thermal conductive members (e.g., dummy via or dummy solder not electrically connected to an integrated circuit in the first die 100) for outwardly transferring heat generated from the first die 100. In some embodiments, the peripheral region PR does not include any wiring lines electrically connected to the integrated circuit in the first die 100. The peripheral region PR may surround the central region CR (e.g., on all sides, from a plan view). The present inventive concepts, however, are not limited thereto, and the peripheral region PR and the central region CR may be placed in various ways, if desired.

The first die 100 may include a first circuit layer 102 and first vias 110.

The first circuit layer 102 may be provided on a bottom surface of the first die 100. The first circuit layer 102 may include the integrated circuit. For example, the first circuit layer 102 may be a memory circuit, a logic circuit, or a combination thereof. For example, the bottom surface of the first die 100 may be an active surface of the first die 100.

The first vias 110 may penetrate in a third direction D3 through the first die 100. The first vias 110 may be conductive vias, formed of an electrically conductive material. The first vias 110 may be electrically connected to the first circuit layer 102. The first vias 110 may include second vias 112 provided on the central region CR and third vias 114 provided on the peripheral region PR.

The second vias 112 may be electrically connected to the integrated circuit of the first die 100. For example, the second vias 112 may be vias for transferring signals that are processed in the integrated circuit in the first die 100. On the central region CR, the second vias 112 may be arranged along the first direction D1 and a second direction D2. For example, the second vias 112 may be provided in a grid shape. Alternatively, the second vias 112 may be arranged in rows, which rows may be shifted (e.g., offset) from each other in the first direction D1 or the second direction D2. For example, the second vias 112 may be disposed in a zigzag fashion along the first direction D1 or the second direction D2. For another example, the second vias 112 may be arranged in a honeycomb shape.

The third vias 114 may be electrically connected to a power circuit or a ground circuit of the first die 100. For example, the third vias 114 may be vias for transferring various signals that drive the integrated circuit in the first die 100. Alternatively, the third vias 114 may be electrically floated in the first die 100. For example, the third vias 114 may be dummy vias, not electrically connected to any other circuit components within the first die. The third vias 114 may be electrically insulated from the second vias 112. On the peripheral region PR, the third vias 114 may be arranged along the first direction D1 and the second direction D2. For example, the third vias 114 may be provided in a grid shape. Alternatively, the third vias 114 may be arranged in rows, which rows may be shifted from each other in the first direction D1 or the second direction D2. For example, the third vias 114 may be disposed in a zigzag fashion along the first direction D1 or the second direction D2. For another example, the third vias 114 may be arranged in a honeycomb shape.

The first die 100 may include first upper pads 120 disposed at a top surface of the first die 100. The first upper pads 120 may include second upper pads 122 provided on the central region CR and third upper pads 124 provided on the peripheral region PR. As described herein, pads are formed of an electrically conductive material, and are formed at a surface of a die or substrate, and may include a flat or substantially flat surface facing away from the die or substrate and/or a flat or substantially flat surface facing internally into the die or substrate. The flat surface facing away from the die may be coplanar with a surface of the die, or may protrude beyond a surface of the die.

The first upper pads 120 may be correspondingly coupled to the first vias 110. For example, on the central region CR, the second upper pads 122 may be coupled to the second vias 112. The second upper pads 122 may each have a circular planar shape. An arrangement of the second upper pads 122 may conform to that of the second vias 112. For example, the second upper pads 122 may be arranged along the first direction D1 and the second direction D2.

A shape and arrangement of the second upper pads 122 may correspond to that of fifth upper pads 222 of the second die 200 that correspond to the second upper pads 122, and thus a detailed shape and arrangement of the second upper pads 122 will be discussed below in detail in explaining the second die 200.

The third upper pads 124 may be correspondingly coupled to the first vias 110. For example, on the peripheral region PR, the third upper pads 124 may be coupled to the third vias 114. The third upper pads 124 may each have a circular planar shape. An arrangement of the third upper pads 124 may conform to that of the third vias 114. For example, the third upper pads 124 may be arranged along the first direction D1 and the second direction D2. According to some embodiments, some of the third upper pads 124 may not be coupled to the third vias 114. For example, the some of the third upper pads 124 may be dummy pads. In this case, the some of the third upper pads 124 may be electrically insulated from the first vias 110. In addition, the third upper pads 124 may be electrically insulated from the second vias 112. The following description will focus on the embodiment of FIG. 1.

A shape and arrangement of the third upper pads 124 may correspond to that of sixth upper pads 224 of the second die 200 that correspond to the third upper pads 124, and thus a detailed shape and arrangement of the third upper pads 124 will be discussed below in detail in explaining the second die 200.

The first die 100 may include external terminals 104. The external terminals 104 may be provided on the bottom surface of the first die 100. The external terminals 104 may be disposed below the first vias 110. Alternatively, first lower pads may be provided on the bottom surface of the first die 100, and the external terminals 104 may be disposed on the first lower pads. The external terminals 104 may be electrically connected to the first circuit layer 102 and the first vias 110. The external terminals 104 may be described as external package terminals.

Although not shown, the first die 100 may further include a protection layer. The protection layer may be provided to the bottom surface of the first die 100, thereby covering the first circuit layer 102. The protection layer may protect the first circuit layer 102. The protection layer may include or be formed of a silicon oxide (SiN) layer. The protection layer may expose the external terminals 104.

A die stack DS may be disposed on the first die 100. The die stack DS may include the second dies 200 stacked on the first die 100. The following will discuss a single second die 200 in describing configurations of the second dies 200.

The second die 200 may be provided. The second die 200 may include an electronic element such as a transistor (e.g., a plurality of electronic elements such as a plurality of transistors, which may be part of an array of memory cells). For example, the second die 200 may be a wafer-level semiconductor die formed of a semiconductor such as silicon (Si). The second die 200 may have a width in a horizontal direction (e.g., D1) less than that of the first die 100, and may have a horizontal area less than that of the first die 100.

When viewed in plan, the second die 200 may have a central region CR positioned on a central portion of the second die 200, and may also have a peripheral region PR that surrounds the central region CR. The central region CR and the peripheral region PR of the second die 200 may correspond to the central region CR and the peripheral region PR of the first die 100. For example, each of the central region CR and the peripheral region PR included in the second die 200 may have a shape substantially the same as that of a corresponding one of the central region CR and the peripheral region PR included in the first die 100. In this description below, sections of the second die 200 that are designated by the same terms used for corresponding sections of the first die 100 will indicate the same sections to which the corresponding sections of the first die 100 are projected.

The central region CR may be positioned on the central portion of the second die 200. The central region CR may be a section on which are provided wiring lines for signals that are processed in an integrated circuit in the second die 200. The peripheral region PR may be either a section on which are provided wiring lines for various signals (e.g., power signal or ground signal) for driving the integrated circuit in the second die 200 or a section on which are provided one or more thermal conductive members (e.g., dummy via or dummy solder) for outwardly transferring heat generated from the second die 200. In some embodiments, the peripheral region PR does not include any wiring lines electrically connected to the integrated circuit in the second die 200. The peripheral region PR may surround the central region CR.

The second die 200 may include a second circuit layer 202 and fourth vias 210. An uppermost second die 200 of the die stack DS may not include the fourth vias 210.

The second circuit layer 202 may be provided on a bottom surface 200b of the second die 200. The second circuit layer 202 may include an integrated circuit. For example, the second circuit layer 202 may include a memory circuit, a logic circuit, or a combination thereof. The bottom surface 200b of the second die 200 may be an active surface of the second die 200.

The fourth vias 210 may penetrate in the third direction D3 through the second die 200. The fourth vias 210 may be electrically connected to the second circuit layer 202. The fourth vias 210 and the first vias 110 may be substantially the same in terms of configuration and arrangement. The fourth vias 210 may include fifth vias 212 provided on the central region CR and sixth vias 214 provided on the peripheral region PR. For example, when viewed in plan, an arrangement of the fifth vias 212 and the sixth vias 214 may be substantially the same as that of the second vias 112 and the third vias 114.

The fifth vias 212 may be electrically connected to the integrated circuit of the second die 200. For example, the fifth vias 212 may be vias for transferring signals that are processed in the integrated circuit in the second die 200. On the central region CR, the fifth vias 212 may be arranged along the first direction D1 and the second direction D2. For example, the fifth vias 212 may be provided in a grid shape. Alternatively, the fifth vias 212 may be arranged in rows, which rows may be shifted (e.g., offset) from each other in the first direction D1 or the second direction D2. For example, the fifth vias 212 may be disposed in a zigzag fashion along the first direction D1 or the second direction D2. For another example, the fifth vias 212 may be arranged in a honeycomb shape.

The sixth vias 214 may be electrically connected to a power circuit or a ground circuit of the second die 200. For example, the sixth vias 214 may be vias for transferring various signals that drive the integrated circuit in the second die 200. Alternatively, at least some of the sixth vias 214 may be electrically floated in the second die 200. For example, the sixth vias 214 may be dummy vias. The sixth vias 214 may be electrically insulated from the fifth vias 212. On the peripheral region PR, the sixth vias 214 may be arranged along the first direction D1 and the second direction D2. For example, the sixth vias 214 may be provided in a grid shape. Alternatively, the sixth vias 214 may be arranged in rows, which rows may be shifted from each other in the first direction D1 or the second direction D2. For example, the sixth vias 214 may be disposed in a zigzag fashion along the first direction D1 or the second direction D2. For another example, the sixth vias 214 may be arranged in a honeycomb shape.

The second die 200 may include fourth upper pads 220 disposed at a top surface 200a of the second die 200. The fourth upper pads 220 may include fifth upper pads 222 provided on the central region CR and sixth upper pads 224 provided on the peripheral region PR. The uppermost second die 200 of the die stack DS may not include the fourth upper pads 220.

The fifth upper pads 222 may be correspondingly coupled to the fourth vias 210. For example, on the central region CR, the fifth upper pads 222 may be coupled to the fifth vias 212.

The sixth upper pads 224 may be correspondingly coupled to the fourth vias 210. For example, on the peripheral region PR, the sixth upper pads 224 may be coupled to the sixth vias 214. According to some embodiments, some of the sixth upper pads 224 may not be coupled to the sixth vias 214. For example, the some of the sixth upper pads 224 may be dummy pads. In this case, the some of the sixth upper pads 224 may be electrically insulated from the fourth vias 210. In addition, the sixth upper pads 224 may be electrically insulated from the fifth vias 212.

The fifth upper pads 222 may have a height substantially the same as that of the sixth upper pads 224. The fifth and sixth upper pads 222 and 224 may have their top surfaces coplanar with the top surface 200a of the second die 200. Alternatively, the fifth and sixth upper pads 222 and 224 may protrude beyond and may be formed on the top surface 200a of the second die 200. The following description will focus on the embodiment of FIGS. 1 and 3. It should be noted that terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

According to the present inventive concepts, the fifth upper pads 222 and the sixth upper pads 224 may be designed to have their arrangements that are different from each other based on fluidity of an under-fill layer 300 which will be discussed below, and thus it may be possible to improve flow of the under-fill layer 300 and thermal radiation of the second dies 200. A shape and arrangement of the fifth upper pads 222 and the sixth upper pads 224 will be discussed in detail with reference to FIGS. 2 to 4. Although FIGS. 2 to 4 depict the arrangement and shape of only the fourth upper pads 220 for convenience of description, an arrangement and shape of second lower pads 230 may correspond to that of the fourth upper pads 220, and the description of the fourth upper pads 220 may be applicable to the second lower pads 230.

Referring to FIGS. 2 to 4, the fifth upper pads 222 may each have a circular planar shape. The fifth upper pads 222 may each have a first width W1 (e.g. a first maximum width). For example, the first width W1 of the fifth upper pad 222 may be in a range from about 15 μm to about 17 μm. An arrangement of the fifth upper pads 222 may conform to that of the fifth vias 212. For example, the fifth upper pads 222 may be arranged at a first arrangement period P1 along the first direction D1 and the second direction D2. The first arrangement period P1 of the fifth upper pads 222 (e.g., a distance between the same respective locations on adjacent fifth upper pads 222 in the D1 and/or D2 direction) may be, for example, from about 25 μm to about 40 μm. The present inventive concepts are not limited to the values of the first width W1 and the first arrangement period P1 of the fifth upper pads 222 discussed in the present embodiment. The first arrangement period P1 and other arrangement periods described herein, may be referred to as a pitch. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

A planar shape of the sixth upper pad 224 may be similar to that of the fifth upper pad 222. The sixth upper pads 224 may each have a circular planar shape. The sixth upper pads 224 may each have a second width W2 (e.g., a second maximum width). The fifth upper pads 222 may each have an area greater than that of each of the sixth upper pads 224. The first width W1 of the fifth upper pad 222 may be greater than the second width W2 of the sixth upper pad 224. For example, the first width W1 of the fifth upper pad 222 may be about 1.01 times to about 1.5 times the second width W2 of the sixth upper pad 224. For example, the second width W2 of the sixth upper pad 224 may be in a range from about 13 µm to about 15 µm, and a first width W1 of the fifth upper pad 222 may be in a range from about 13.13 µm to about 22.5 µm. An arrangement of the sixth upper pads 224 may conform to that of the sixth vias 214. For example, the sixth upper pads 224 may be arranged at a second arrangement period P2 along the first direction D1 and the second direction D2. The second arrangement period P2 of the sixth upper pads 224 may be substantially the same as or similar to the first arrangement period P1 of the fifth upper pads 222. For example, the second arrangement period P2 of the sixth upper pads 224 may be in a range from about 25 µm to about 40 µm. An interval between the sixth upper pads 224 may be greater than that between the fifth upper pads 222. The present inventive concepts are not limited to the values of the second width W2 and the second arrangement period P2 of the sixth upper pads 224 discussed in the present embodiment.

A ratio of the first width W1 to the first arrangement period P1 of the fifth upper pads 222 may be greater than that of the second width W2 to the second arrangement period P2 of the sixth upper pads 224. For example, the first ratio may be about 1.01 times to about 1.5 times the second ratio.

According to some embodiments of the present inventive concepts, there may be a large transferring amount of electrical signals on the central region CR on which are provided wiring lines for an integrated circuit in the second die 200 and for signals that are processed in the integrated circuit in the second die 200, and accordingly a large amount of heat may be generated from the central region CR. As the fifth upper pads 222 provided on the central region CR are configured to have increased areas, heat generated from the second die 200 may be more easily discharged outwardly through the fifth upper pads 222. As a result, it may be possible to provide a semiconductor package with improved efficiency of thermal radiation.

FIGS. 2 and 4 depict that the fourth upper pads 220 have circular planar shapes, but the present inventive concepts are not limited thereto. As illustrated in FIG. 5, the fourth upper pads 220 may each have a tetragonal planar shape. Alternatively, as illustrated in FIG. 6, the fourth upper pads 220 may each have a hexagonal planar shape. Dissimilarly, as illustrated in FIG. 7, the fourth upper pads 220 may each have an octagonal planar shape. Differently, the fourth upper pads 220 may each have a polygonal planar shape, an elliptical planar shape, or linear planar shape. The fifth upper pads 222 and the sixth upper pads 224 may have their planar shapes that are substantially the same as or similar to each other. In the embodiments mentioned above, the fifth upper pads 222 may be larger than the sixth upper pads 224 in terms of side length, width, radius, area, and/or diameter. For convenience of description, FIGS. 5 to 7 omit illustration of a configuration of a convex portion CP which will be discussed below.

Referring back to FIGS. 1 to 4, the second die 200 may include second lower pads 230 disposed on the bottom surface 200b of the second die 200. The second lower pads 230 may include third lower pads 232 provided on the central region CR and fourth lower pads 234 provided on the peripheral region PR. A planar arrangement and shape of the third lower pads 232 and the fourth lower pads 234 may be substantially the same as or similar to that of the fifth upper pads 222 and the sixth upper pads 224.

The third lower pads 232 may be provided on the central region CR, and may be coupled to the second circuit layer 202 or the fifth vias 212. A planar shape of the third lower pads 232 may conform to that of the fifth upper pads 222 of the second die 200 disposed below the third lower pads 232. For example, the third lower pads 232 may each have a circular planar shape. The third lower pads 232 may each have a width substantially the same as or similar to the first width W1 of the fifth upper pad 222. An arrangement of the third lower pads 232 may conform to that of the fifth upper pads 222 of the second die 200 disposed below the third lower pads 232. For example, the third lower pads 232 may be arranged along the first direction D1 and the second direction D2. An arrangement period of the third lower pads 232 may be substantially the same as or similar to the first arrangement period P1 of the fifth upper pads 222. The third lower pads 232 may be vertically aligned with the fifth upper pads 222.

The fourth lower pads 234 may be provided on the peripheral region PR, and may be coupled to the second circuit layer 202 or the sixth vias 214. In addition, the fourth lower pads 234 may be electrically insulated from the fifth vias 212. A planar shape of the fourth lower pads 234 may conform to that of the sixth upper pads 224 of the second die 200 disposed below the fourth lower pads 234. For example, the fourth lower pads 234 may each have a circular planar shape. The fourth lower pads 234 may each have a width substantially the same as or similar to the second width W2 of the sixth upper pad 224. The third lower pads 232 may each have a width greater than that of each of the fourth lower pads 234. An arrangement of the fourth lower pads 234 may conform to that of the sixth upper pads 224 of the second die 200 disposed below the fourth lower pads 234. For example, the fourth lower pads 234 may be arranged along the first direction D1 and the second direction D2. An arrangement period of the fourth lower pads 234 may be substantially the same as or similar to the second arrangement period P2 of the sixth upper pads 224. The arrangement period of the fourth lower pads 234 may be substantially the same as or similar to that of the third lower pads 232. A ratio of the width of the third lower pads 232 to the arrangement period of the third lower pads 232 may be greater than that of the width of the fourth lower pads 234 to the arrangement period of the fourth lower pads 234. An interval between the fourth lower pads 234 may be greater than that between the third lower pads 232. The fourth lower pads 234 may be vertically aligned with the sixth upper pads 224.

FIG. 1 depicts that the second lower pads 230 have their bottom surfaces coplanar with the bottom surface 200b of the second die 200, but the present inventive concepts are not limited thereto. The second lower pads 230 may protrude beyond the bottom surface 200b of the second die 200.

Neighboring second dies 200 may be connected to each other through the connection terminals 240. For example, the connection terminals 240 may be in contact with top surfaces of the fourth upper pads 220 and bottom surfaces of the second lower pads 230. In this case, the connection terminals 240 may fill a space between the fourth upper pads 220 and the second lower pads 230. The term "contact," as used herein, refers to a direct connection (i.e., touching) unless the context indicates otherwise.

On the central region CR, first connection terminals 242 may connect the fifth upper pads 222 to the third lower pads 232 that face the fifth upper pads 222. On the peripheral region PR, second connection terminals 244 may connect the sixth upper pads 224 to the fourth lower pads 234 that face the sixth upper pads 224. The second dies 200 may be electrically connected to each other through the fifth upper pads 222, the first connection terminals 242, and the third lower pads 232. The second dies 200 may receive various signals (e.g., power signal or ground signal) through the sixth upper pads 224, the second connection terminals 244, and the fourth lower pads 234, which various signals are used for driving the integrated circuit in the second die 200. The connection terminals 240 may include solder balls or solder bumps. A planar shape and arrangement of the connection terminals 240 may conform to that of the fourth upper pads 220. For example, the first connection terminals 242 may each have a width greater than that of each of the second connection terminals 244.

Each of the connection terminals 240 may have a convex portion CP provided on a lateral surface thereof. The convex portion CP may protrude onto lateral surfaces of the fourth upper pad 220 and the second lower pad 230 that are in contact with the connection terminal 240. For a single connection terminal 240, the convex portion CP may be directed in an outward direction from the connection terminal 240 (e.g., it may not be directed inward, so that there is no convex portion of the connection terminal 240 opposite the convex portion CP). In this description, the outward direction may be a direction from a center of the second die 200 toward an outside of the second die 200, and may be radially directed from the center of the second die 200. For example, the convex portion CP may protrude in a direction away from the center of the second die 200 from the connection terminal 240. The convex portions CP may have their heights (e.g., in a horizontal direction—also described as lengths) that correspond to a distance to a ridge of the convex portion CP from the lateral surfaces of the fourth upper pads 220 and the second lower pads 230, and the heights may increase in a direction from the center of the second die 200 toward the outside of the second die 200. The "height" of a convex portion of a connection terminal 240, as used herein, refers to a maximum protruding distance, in a horizontal direction, to a ridge of the convex portion in a direction perpendicular to the lateral surfaces of the pads to which the connection terminal 240 is connected. For example, a first height of the convex portion CP of each of the first connection terminals 242 on the central region CR may be less than a second height of the convex portion CP of each of the second connection terminals 244 on the peripheral region PR. The convex portions CP may be spaced apart from the connection terminals 240 of the pads 220 and 230 adjacent in a direction in which the convex portions CP protrude.

According to some embodiments of the present inventive concepts, the sixth upper pads 224 and the fourth lower pads 234 may have their small widths on the peripheral region PR where the convex portions CP have their large heights, and thus a large interval may be provided between the sixth upper pads 224 and between the fourth lower pads 234. Therefore, on the peripheral region PR, there may be no occurrence of electrical short caused by contact between the second connection terminals 244. Accordingly, it may be possible to provide a semiconductor package with improved electrical stability.

Moreover, even when the fifth upper pads 222 and the third lower pads 232 have their large widths on the central region CR where the convex portions CP have their small heights, an interval between the fifth upper pads 222 may not be small, and also an interval between the third lower pads 232 may not be small. Therefore, heat generated from the second die 200 may be easily discharged outwardly through the fifth upper pads 222 while preventing an electrical short between the connection terminals 240. Accordingly, it may be possible to provide a semiconductor package with increased efficiency of thermal radiation and improved operating stability.

The connection terminals 240 may have concave portions RP provided on the lateral surfaces thereof. The concave portion RP may be recessed from the lateral surfaces of the fourth upper pad 220 and the second lower pad 230 that are in contact with the connection terminal 240. For a single connection terminal 240, the concave portion RP may be directed in an inward direction from the connection terminal 240. In this description, the inward direction may mean a direction from the outside of the second die 200 toward the center of the second die 200. For example, the concave portion RP may be positioned in a direction from the connection terminal 240 toward the center of the second die 200. The concave portions RP may have their depths that correspond to a distance to a bottom surface of the concave portion RP from the lateral surfaces of the fourth upper pads 220 and the second lower pads 230, and the depths may increase in a direction from the center of the second die 200 toward the outside of the second die 200. For example, a first depth of the concave portion RP of each of the first connection terminals 242 on the central region CR may be less than a second depth of the concave portion RP of each of the second connection terminals 244 on the peripheral region PR.

The heights of the convex portions CP and the depths of the concave portions RP may be different depending on position, and the difference in height and depth may be induced due to fluidity of a material that constitutes an under-fill layer 300, which is discussed below, between the second dies 200 in semiconductor package fabrication. This will be further discussed below in detail in describing a method of fabricating a semiconductor package.

The die stack DS and the first die 100 may constitute a chip-on-wafer (COW) structure. For example, the connection terminals 240 may be attached onto the bottom surface 200*b* of a lowermost second die 200, and the lowermost second die 200 may face down to allow its bottom surface 200*b* to face toward the top surface of the first die 100. The connection terminals 240 provided on the second lower pads 230 may be used to mount the lowermost second die 200 on the first die 100. The first upper pads 120 of the first die 100 may be connected through the connection terminals 240 to the second lower pads 230 of the second die 200.

An under-fill layer 300 may be provided between the second dies 200 and between the die stack DS and the first die 100. The under-fill layer 300 may be a dielectric layer that fills a space between the second dies 200. The under-fill layer 300 may include or be a non-conductive film (NCF). For example, the under-fill layer 300 may be a polymer tape that includes a dielectric material. Alternatively, the under-fill layer 300 may include or be a fluidic adhesive member. The under-fill layer 300 may be interposed between the connection terminals 240 to prevent the occurrence of electric short between the connection terminals 240. The under-fill layer 300 may have a planar shape similar to that of the second dies 200. The under-fill layer 300 may partially protrude beyond lateral surfaces of the second dies 200.

A molding layer 400 may be disposed on the first die 100. The molding layer 400 may cover the top surface of the first die 100. When viewed in plan view, the molding layer 400 may surround the die stack DS. The molding layer 400 may include or be a dielectric polymer material. For example, the molding layer 400 may include or be an epoxy molding compound (EMC).

In the embodiments that follow, a detailed description of technical features repetitive to those discussed above with reference to FIGS. 1 to 7 will be omitted, and a difference thereof will be discussed in detail. The same reference numerals may be allocated to the same components as those of the semiconductor package according to some embodiments of the present inventive concepts.

Figure 8:
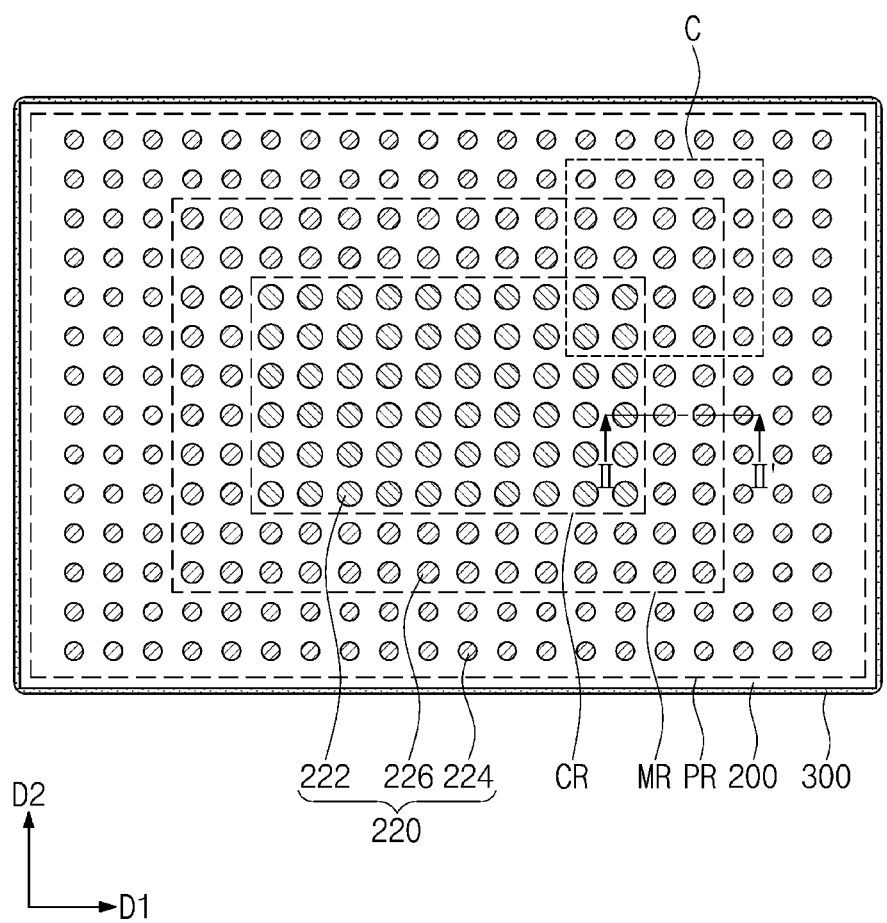
FIG. 8 illustrates a plan view showing a semiconductor package according to some embodiments of the present inventive concepts.
Figure 9:
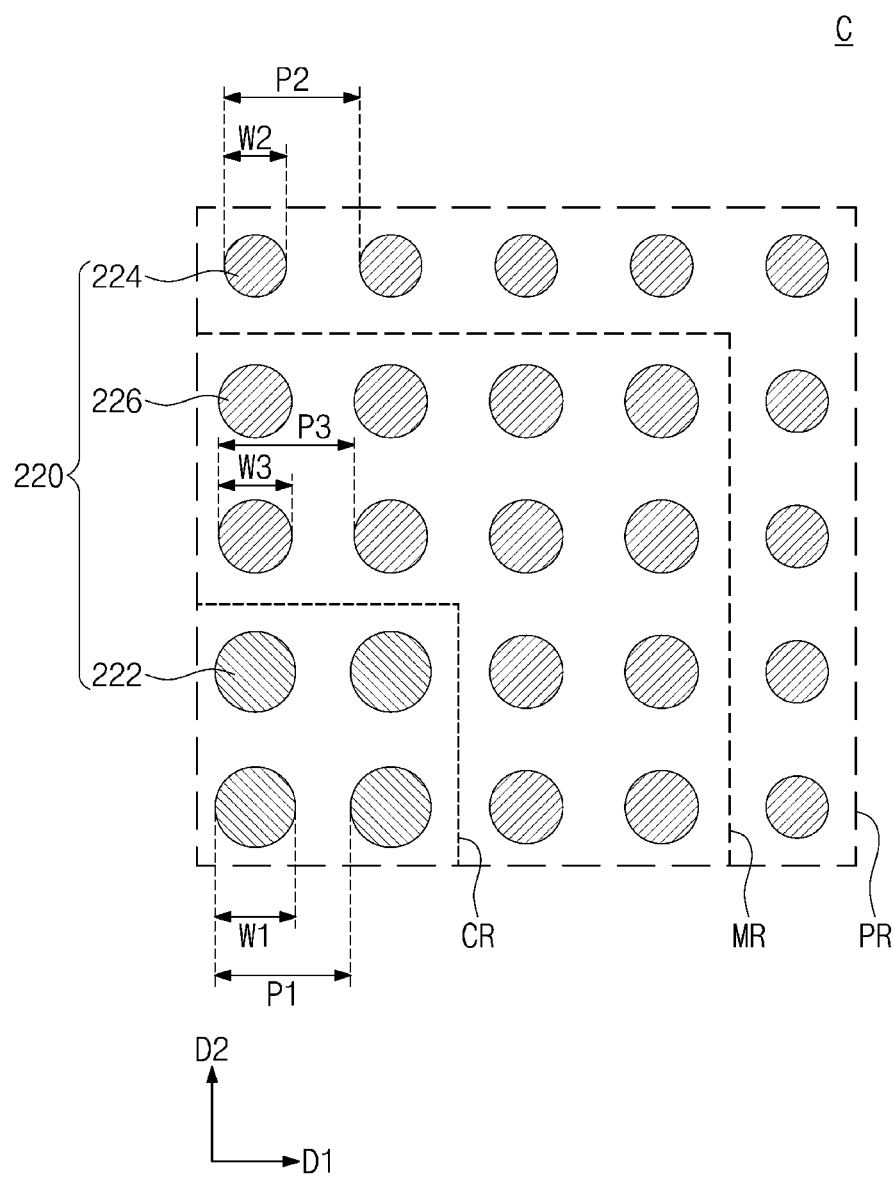
FIG. 9 illustrates an enlarged view showing section C of FIG. 8.
Figure 10:
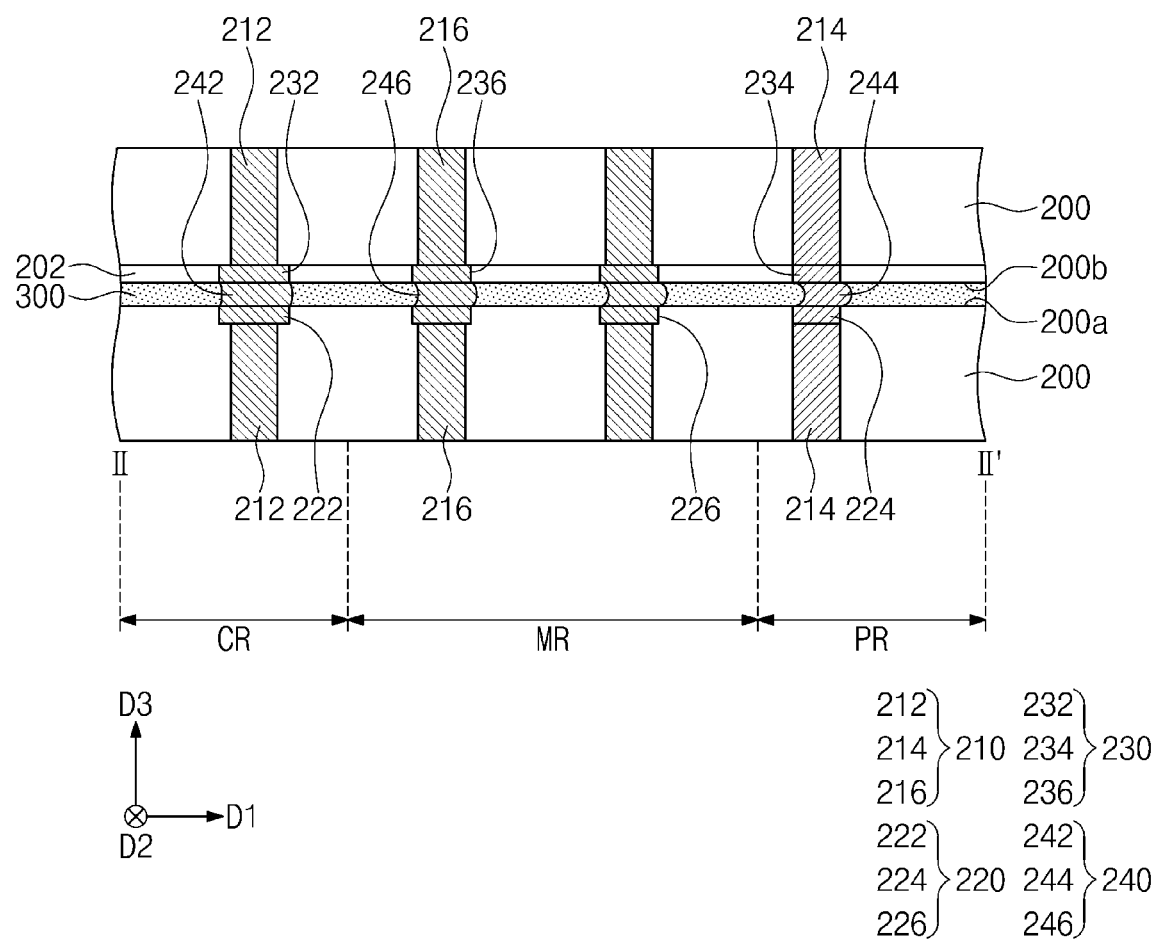
FIG. 10 illustrates an enlarged cross-sectional view taken along line II-II' of FIG. 8, showing section A of FIG. 1.

FIG. 8 illustrates a plan view showing a semiconductor package according to some embodiments of the present inventive concepts. FIG. 9 illustrates an enlarged view showing section C of FIG. 8. FIG. 10 illustrates an enlarged cross-sectional view taken along line II-II' of FIG. 8, showing a similar section as for FIG. 8 as section A of FIG. 1.

Referring to FIGS. 8 to 10, when viewed in plan view, the second die 200 may include a central region CR positioned on a central portion of the second die 200, a peripheral region PR that surrounds the central region CR, and a middle region MR (also described as an intermediate region) between the central region CR and the peripheral region PR. The central region CR may be positioned on the central portion of the second die 200. The middle region MR may surround the central region CR.

The second die 200 may include a second circuit layer 202 and fourth vias 210.

The fourth vias 210 may penetrate in the third direction D3 through the second die 200. The fourth vias 210 may be electrically connected to the second circuit layer 202. The fourth vias 210 may include fifth vias 212 provided on the central region CR, sixth vias 214 provided on the peripheral region PR, and seventh vias 216 provided on the middle region MR.

The fifth vias 212 may be electrically connected to an integrated circuit of the second die 200. For example, the fifth vias 212 may be vias for transferring signals that are processed in the integrated circuit in the second die 200.

The sixth vias 214 may be electrically floated in the second die 200. For example, the sixth vias 214 may be dummy vias. The sixth vias 214 may be electrically insulated from the fifth vias 212.

The seventh vias 216 may be electrically connected to a power circuit or a ground circuit of the second die 200. For example, the seventh vias 216 may be vias for transferring various signals that drive the integrated circuit in the second die 200. The seventh vias 216 may be electrically insulated from the fifth vias 212. On the middle region MR, the seventh vias 216 may be arranged along the first direction D1 and the second direction D2. For example, the seventh vias 216 may be provided in a grid shape. Alternatively, the seventh vias 216 may be arranged in rows, which rows may be shifted from each other in the first direction D1 or the second direction D2. For another example, the seventh vias 216 may be arranged in a honeycomb shape.

The second die 200 may include fourth upper pads 220 disposed on the top surface 200a of the second die 200. The fourth upper pads 220 may include fifth upper pads 222 provided on the central region CR, sixth upper pads 224 provided on the peripheral region PR, and seventh upper pads 226 provided on the middle region MR.

The fifth upper pads 222 may be correspondingly coupled to the fourth vias 210. For example, on the central region CR, the fifth upper pads 222 may be coupled to the fifth vias 212.

The fifth upper pads 222 may each have a circular planar shape. The fifth upper pads 222 may each have a first width W1 (e.g., maximum width). For example, the first width W1 of the fifth upper pad 222 may be in a range from about 15 μm to about 17 μm. The fifth upper pads 222 may be arranged at a first arrangement period P1 along the first direction D1 and the second direction D2. For example, the first arrangement period P1 of the fifth upper pads 222 may be in a range from about 25 μm to about 40 μm.

The sixth upper pads 224 may be correspondingly coupled to the fourth vias 210. For example, on the peripheral region PR, the sixth upper pads 224 may be coupled to the sixth vias 214. Because the sixth vias 214 may be electrically floated, at least some of the sixth upper pads 224 may be dummy pads. Also, according to some embodiments, some of the sixth upper pads 224 may not be coupled to the sixth vias 214. For example, these sixth upper pads 224 may also be dummy pads.

A planar shape of the sixth upper pad 224 may be similar to that of the fifth upper pad 222. The sixth upper pads 224 may each have a circular planar shape. The fifth upper pads 222 may each have an area greater than that of each of the sixth upper pads 224. The first width W1 of the fifth upper pad 222 may be greater than a second width W2 (e.g., maximum width) of the sixth upper pad 224. For example, the first width W1 of the fifth upper pad 222 may be about 1.01 times to about 1.5 times the second width W2 of the sixth upper pad 224. The second width W2 of the sixth upper pad 224 may be in a range, for example, from about 13 μm to about 15 μm. The sixth upper pads 224 may be arranged at a second arrangement period P2 along the first direction D1 and the second direction D2. The second arrangement period P2 of the sixth upper pads 224 may be substantially the same as or similar to the first arrangement period P1 of the fifth upper pads 222. For example, the second arrangement period P2 of the sixth upper pads 224 may be in a range from about 25 μm to about 40 μm. An interval between the sixth upper pads 224 may be greater than that between the fifth upper pads 222.

The seventh upper pads 226 may be correspondingly coupled to the fourth vias 210. For example, on the middle region MR, the seventh upper pads 226 may be coupled to the seventh vias 216. The seventh upper pads 226 may have their heights (e.g., in the D3 direction substantially the same as those of the sixth upper pads 224 and those of the fifth upper pads 222. The fifth, sixth, and seventh upper pads 222, 224, and 226 may have their top surfaces coplanar with the top surface 200a of the second die 200.

The seventh upper pads 226 may have their planar shapes similar to those of the fifth upper pads 222 and those of the sixth upper pads 224. The seventh upper pads 226 may each have a circular planar shape. The seventh upper pads 226 may have their areas greater than those of the sixth upper pads 224 and less than those of the fifth upper pads 222. The seventh upper pads 226 may each have a third width W3 (e.g., maximum width). The third width W3 of the seventh upper pad 226 may be less than the first width W1 of the fifth upper pad 222 and greater than the second width W2 of the sixth upper pad 224. For example, the third width W3 of the seventh upper pad 226 may be about 1.01 times to about 1.2 times the second width W2 of the sixth upper pad 224. The third width W3 of the seventh upper pad 226 may be in a range, for example, from about 13 μm to about 15 ium. An arrangement of the seventh upper pads 226 may conform to that of the seventh vias 216. For example, the seventh upper pads 226 may be arranged at a third arrangement period P3 along the first direction D1 and the second direction D2. The third arrangement period P3 of the seventh upper pads 226 may be substantially the same as or similar to the first arrangement period P1 of the fifth upper pads 222 and the second arrangement period P2 of the sixth upper pads 224. For example, the third arrangement period P3 of the seventh upper pads 226 may be in a range from about 25 μm to about 40 μm. An interval between the seventh upper pads 226 may be greater than that between the fifth upper pads 222 and less than that between the sixth upper pads 224.

A third ratio of the third width W3 to the third arrangement period P3 of the seventh upper pads 226 may be less than a first ratio of the first width W1 to the first arrangement period P1 of the fifth upper pads 222 and greater than a second ratio of the second width W2 to the second arrangement period P2 of the sixth upper pads 224. For example, the third ratio may be about 1.01 times to about 1.2 times the second ratio.

The second die 200 may include second lower pads 230 disposed on the bottom surface 200b of the second die 200. The second lower pads 230 may include third lower pads 232 provided on the central region CR, fourth lower pads 234 provided on the peripheral region PR, and fifth lower pads 236 provided on the middle region MR. A planar arrangement and shape of the third lower pads 232, the fourth lower pads 234, and fifth lower pads 236 may be substantially the same as or similar to that of the fifth upper pads 222, the sixth upper pads 224, and the seventh upper pads 226.

The third lower pads 232 may each have a circular planar shape. The third lower pads 232 may each have a width substantially the same as or similar to the first width W1 of the fifth upper pad 222. An arrangement of the third lower pads 232 may conform to that of the fifth upper pads 222 of the second die 200 disposed below the third lower pads 232. An arrangement period of the third lower pads 232 may be substantially the same as or similar to the first arrangement period P1 of the fifth upper pads 222. The third lower pads 232 may be vertically aligned with the fifth upper pads 222.

The fourth lower pads 234 may each have a circular planar shape. The fourth lower pads 234 may each have a width substantially the same as or similar to the second width W2 of the sixth upper pad 224. The third lower pads 232 may each have a width greater than that of each of the fourth lower pads 234. An arrangement of the fourth lower pads 234 may conform to that of the sixth upper pads 224 of the second die 200 disposed below the fourth lower pads 234. An arrangement period of the fourth lower pads 234 may be substantially the same as or similar to the second arrangement period P2 of the sixth upper pads 224. A ratio of the width of the third lower pads 232 to the arrangement period of the third lower pads 232 may be greater than that of the width of the fourth lower pads 234 to the arrangement period of the fourth lower pads 234. An interval between the fourth lower pads 234 may be greater than that between the third lower pads 232. The fourth lower pads 234 may be vertically aligned with the sixth upper pads 224.

The fifth lower pads 236 may each have a circular planar shape. The fifth lower pads 236 may each have a width substantially the same as or similar to the third width W3 of the seventh upper pad 226. The width of the fifth lower pad 236 may be less than that of the third lower pad 232 and greater than that of the fourth lower pad 234. An arrangement of the fifth lower pads 236 may conform to that of the seventh upper pads 226 of the second die 200 disposed below the fifth lower pads 236. An arrangement period of the fifth lower pads 236 may be substantially the same as or similar to the third arrangement period P3 of the seventh upper pads 226. The arrangement period of the fifth lower pads 236 may be substantially the same as or similar to that of the third lower pads 232. A ratio of the width of the fifth lower pads 236 to the arrangement period of the fifth lower pads 236 may be less than that of the width of the third lower pads 232 to the arrangement period of the third lower pads 232 and greater than that of the width of the fourth lower pads 234 to the arrangement period of the fourth lower pads 234. An interval between the fifth lower pads 236 may be greater than that between the third lower pads 232 and less than that between the fourth lower pads 234. The fifth lower pads 236 may be vertically aligned with the seventh upper pads 226.

Neighboring second dies 200 may be connected to each other through the connection terminals 240. For example, the connection terminals 240 may be in contact with top surfaces of the fourth upper pads 220 and bottom surfaces of the second lower pads 230. In this case, the connection terminals 240 may fill a space between the fourth upper pads 220 and the second lower pads 230.

On the central region CR, first connection terminals 242 may connect the fifth upper pads 222 to the third lower pads 232 that face the fifth upper pads 222. On the peripheral region PR, second connection terminals 244 may connect the sixth upper pads 224 to the fourth lower pads 234 that face the sixth upper pads 224. On the middle region MR, third connection terminals 246 may connect the seventh upper pads 226 to the fifth lower pads 236 that face the seventh upper pads 226.

The connection terminals 240 may have convex portions CP that outwardly protrude on lateral surfaces thereof. The convex portion CP may protrude beyond lateral surfaces of the fourth upper pad 220 and the second lower pad 230 that are in contact with the connection terminal 240. The convex portions CP may have their heights (e.g., in a horizontal direction) that correspond to a distance to a ridge of the convex portion CP from the lateral surfaces of the fourth upper pads 220 and the second lower pads 230, and the heights may increase in a direction from the center of the second die 200 toward the outside of the second die 200. The convex portions CP may be spaced apart from the connection terminals 240 of the pads 220 and 230 adjacent in a direction in which the convex portions CP protrude.

According to some embodiments of the present inventive concepts, on the central, middle, and peripheral regions CR, MR, and PR, the fourth upper pads 220 may be configured to have different widths from each other and the second lower pads 230 may be configured to have different widths from each other, and thus there may be no occurrence of electrical short caused by contact between the second connection terminals 244 on the peripheral region PR, and heat generated from the second die 200 may be easily discharged outwardly through the fourth upper pads 220 while preventing an electrical short between the connection terminals 240. Accordingly, it may be possible to provide a semiconductor package with improved electrical stability.

Figure 11:
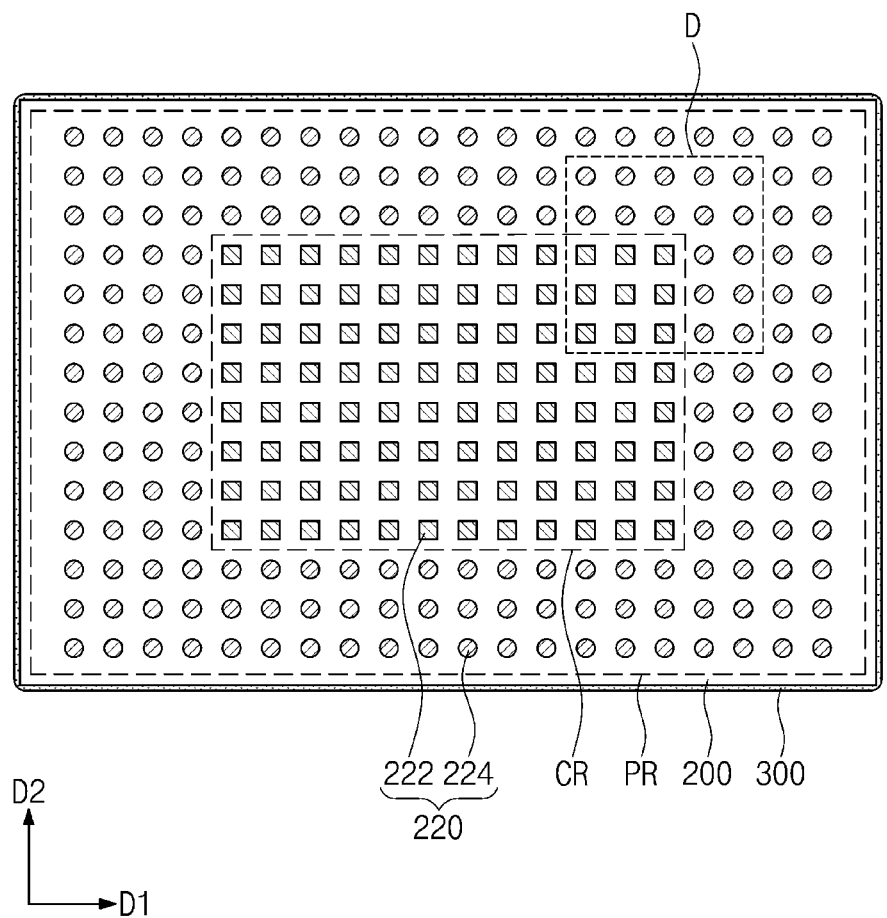
FIG. 11 illustrates a plan view showing a semiconductor package according to some embodiments of the present inventive concepts.
Figure 12:
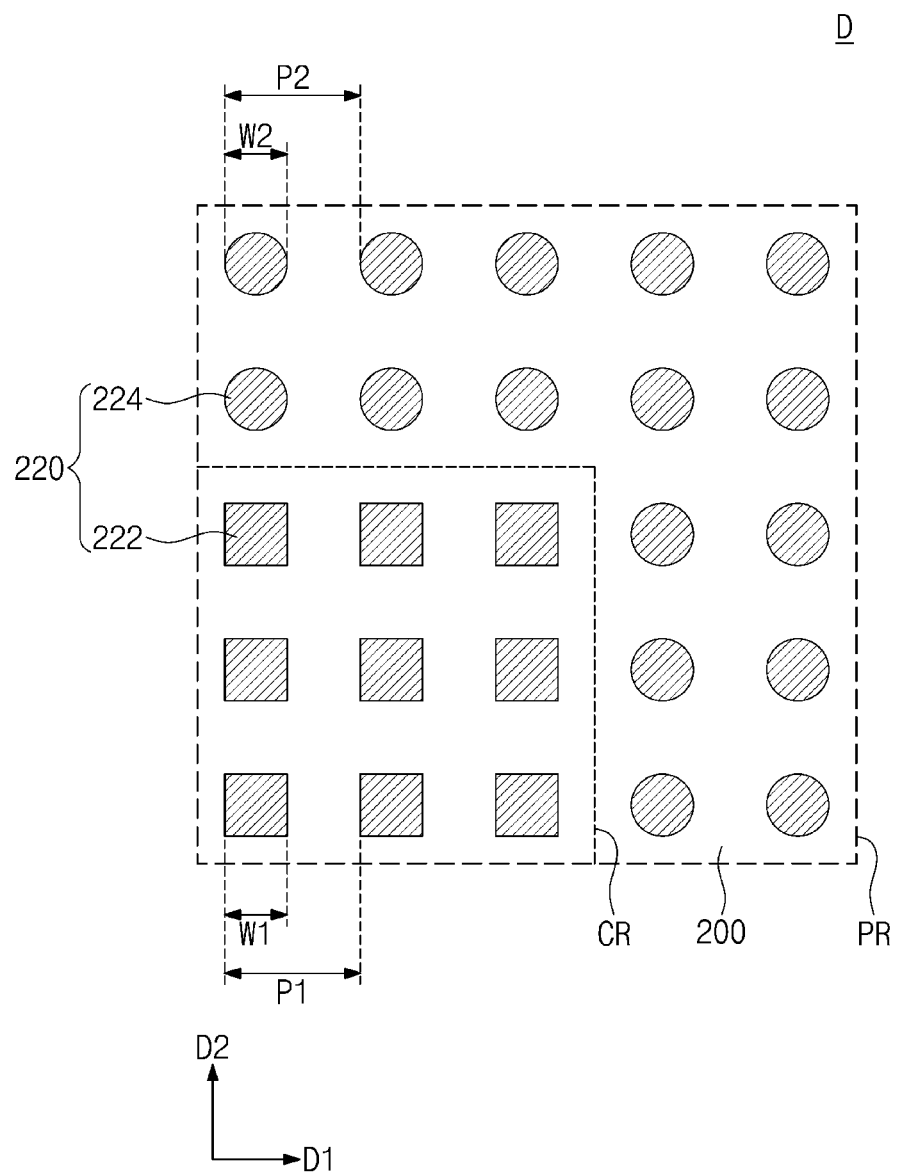
FIG. 12 illustrates an enlarged view showing section D of FIG. 11.

FIG. 11 illustrates a plan view showing a semiconductor package according to some embodiments of the present inventive concepts. FIG. 12 illustrates an enlarged view showing section D of FIG. 11.

Referring to FIGS. 1, 11, and 12, the second die 200 may include fourth upper pads 220 disposed on the top surface 200a of the second die 200. The fourth upper pads 220 may include fifth upper pads 222 provided on the central region CR and sixth upper pads 224 provided on the peripheral region PR.

The fifth upper pads 222 may be correspondingly coupled to the fourth vias 210. For example, on the central region CR, the fifth upper pads 222 may be coupled to the fifth vias 212.

The sixth upper pads 224 may be correspondingly coupled to the fourth vias 210. For example, on the peripheral region PR, the sixth upper pads 224 may be coupled to the sixth vias 214.

According to the present inventive concepts, the fifth and sixth upper pads 222 and 224 may be designed to have different shapes from each other, and thus it may be possible to increase thermal radiation of the second dies 200. In figures of embodiments below, although an arrangement and shape of only the fourth upper pads 220 is illustrated for convenience of description, an arrangement and shape of the second lower pads 230 may correspond to that of the fourth upper pads 220, and the description of the fourth upper pads 220 may be applicable to the second lower pads 230.

The fifth upper pads 222 may each have a tetragonal planar shape. Alternatively, the fifth upper pads 222 may each have a polygonal planar shape. The fifth upper pads 222 may each have a first width W1 (e.g., maximum width in a first direction D1). The fifth upper pads 222 may be arranged at a first arrangement period P1 along the first direction D1 and the second direction D2.

The sixth upper pads 224 may each have a circular planar shape. The sixth upper pads 224 may each have a second width W2 (e.g., maximum width in the first direction D1). The first width W1 of the fifth upper pad 222 may be the same as the second width W2 of the sixth upper pad 224. As the fifth and sixth upper pads 222 and 224 have different shapes whose widths are the same, the fifth upper pads 222 may each have an area greater than that of each of the sixth upper pads 224. The sixth upper pads 224 may be arranged at a second arrangement period P2 along the first direction D1 and the second direction D2. The second arrangement period P2 of the sixth upper pads 224 may be substantially the same as or similar to the first arrangement period P1 of the fifth upper pads 222. An interval between the sixth upper pads 224 may be substantially the same as that between the fifth upper pads 222.

According to some embodiments of the present inventive concepts, there may be a large transferring amount of electrical signals on the central region CR on which are provided wiring lines for an integrated circuit in the second die 200 and for signals that are processed in the integrated circuit in the second die 200, and accordingly a large amount of heat may be generated from the central region CR. As the fifth upper pads 222 provided on the central region CR are configured to have their increased areas, heat generated from the second die 200 may be easily discharged outwardly through the fifth upper pads 222. In conclusion, it may be possible to provide a semiconductor package with improved efficiency of thermal radiation. In addition, aspects of the embodiments of FIGS. 1-10 may be included in the embodiment of FIGS. 11 and 12, for example for the connection terminals 240.

Figure 13:
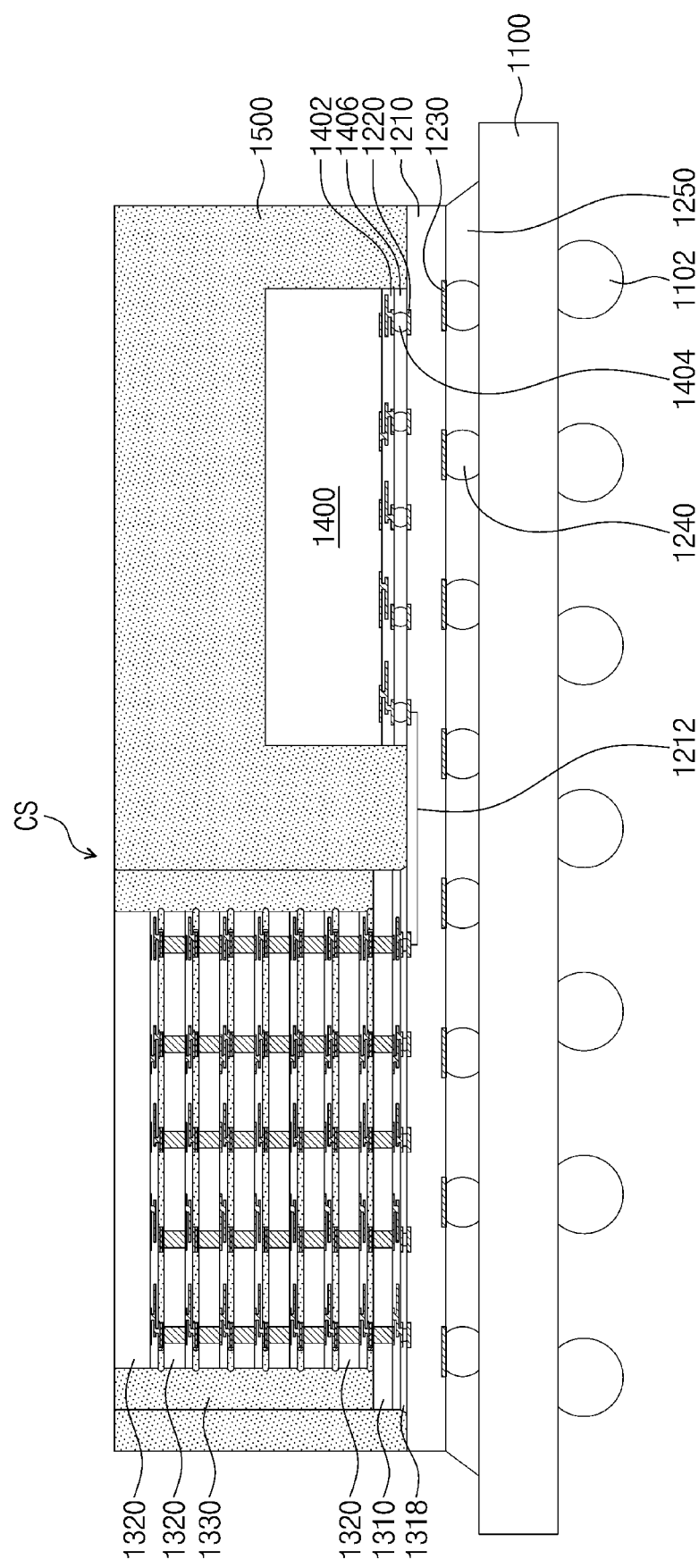
FIG. 13 illustrates a cross-sectional view showing a semiconductor package according to some embodiments of the present inventive concepts.

FIG. 13 illustrates a cross-sectional view showing a semiconductor package according to some embodiments of the present inventive concepts.

Referring to FIG. 13, a package substrate 1100 may be provided. The package substrate 1100 may include a printed circuit board (PCB) having a signal pattern on a top surface thereof. Alternatively, the package substrate 1100 may have a structure in which one or more dielectric layers are stacked alternately with one or more wiring layers. The package substrate 1100 may have pads disposed on a top surface thereof.

A plurality of external terminals 1102 may be disposed below the package substrate 1100. For example, the external terminals 1102 may be disposed on terminal pads provided on a bottom surface of the package substrate 1100. The external terminals 1102 may include solder balls or solder bumps, and based on type of the external terminals 1102, a semiconductor package may be provided in the form of one of a ball grid array (BGA) type, a fine ball-grid array (FBGA) type, and a land grid array (LGA) type.

An interposer substrate 1210 may be provided on the package substrate 1100. The interposer substrate 1210 may be mounted on the top surface of the package substrate 1100. The interposer substrate 1210 may include first substrate pads 1220 that are exposed on a top surface of the interposer substrate 1210 and second substrate pads 1230 that are exposed on a bottom surface of the interposer substrate 1210. The interposer substrate 1210 may redistribute a chip stack CS and a second semiconductor chip 1400 which will be discussed below. For example, the first substrate pads 1220 and the second substrate pads 1230 may be electrically connected through circuit lines in the interposer substrate 1210, and a redistribution circuit may be constituted by the first substrate pads 1220, the second substrate pads 1230, and the circuit lines. The interposer substrate 1210 may include or be formed of a dielectric material or silicon (Si). When the interposer substrate 1210 includes silicon (Si), the interposer substrate 1210 may be a silicon interposer substrate having one or more through electrodes that vertically penetrate therethrough. The first substrate pads 1220 and the second substrate pads 1230 may include a conductive material, such as metal. For example, the first and second substrate pads 1220 and 1230 may include copper (Cu).

The interposer substrate 1210 may be provided with substrate terminals 1240 on the bottom surface thereof. The substrate terminals 1240 may be provided between the pads of the package substrate 1100 and the second substrate pads 1230 of the interposer substrate 1210. The substrate terminals 1240 may electrically connect the interposer substrate 1210 to the package substrate 1100. For example, the interposer substrate 1210 may be flip-chip mounted on the package substrate 1100. The substrate terminals 1240 may include solder balls or solder bumps.

A first under-fill layer 1250 may be provided between the package substrate 1100 and the interposer substrate 1210. The first under-fill layer 1250 may surround the substrate terminals 1240, while filling a space between the package substrate 1100 and the interposer substrate 1210.

A chip stack CS may be disposed on the interposer substrate 1210. The chip stack CS may be a semiconductor package discussed with reference to FIGS. 1 to 12. For example, the chip stack CS may include a base semiconductor chip 1310, first semiconductor chips 1320 that are stacked on the base semiconductor chip 1310, and a first molding layer 1330 that surrounds the first semiconductor chips 1320. For example, the base semiconductor chip 1310 may correspond to the first die 100 of FIG. 1, the first semiconductor chips 1320 may correspond to the second dies 200 of FIG. 1, and the first molding layer 1330 may correspond to the molding layer 400 of FIG. 1.

The first semiconductor chips 1320 may have a central region and a peripheral region that surrounds the central region. The first semiconductor chips 1320 may be provided with upper pads on top surfaces thereof and with lower pads on bottom surfaces thereof. The upper pads on the first semiconductor chips 1320 may have large widths on the central region and small widths on the peripheral region. An interval between the upper pads of the first semiconductor chips 1320 and an interval between the lower pads of the first semiconductor chips 1320 may be substantially the same as or similar to each other on the central region and the peripheral region.

The chip stack CS may be mounted on the interposer substrate 1210. For example, the chip stack CS may be coupled through stack connection terminals of the base semiconductor chip 1310 to the first substrate pads 1220 of the interposer substrate 1210.

A second under-fill layer 1318 may be provided between the interposer substrate 1210 and the chip stack CS. The second under-fill layer 1318 may surround the stack connection terminals, while filling a space between the interposer substrate 1210 and the base semiconductor chip 1310.

A second semiconductor chip 1400 may be disposed on the interposer substrate 1210. On the interposer substrate 1210, the second semiconductor chip 1400 may be disposed horizontally spaced apart from the chip stack CS. The second semiconductor chip 1400 may have a thickness greater than those of the first semiconductor chips 1320. The second semiconductor chip 1400 may include or be formed of a semiconductor material, such as silicon (Si). The second semiconductor chip 1400 may include a circuit layer 1402. The circuit layer 1402 may include a logic circuit. For example, the second semiconductor chip 1400 may be a logic chip. A bottom surface of the second semiconductor chip 1400 may be an active surface, and a top surface of the second semiconductor chip 1400 may be an inactive surface. A plurality of bumps 1404 may be provided on the bottom surface of the second semiconductor chip 1400. For example, the second semiconductor chip 1400 may be coupled through the bumps 1404 to the first substrate pads 1220 of the interposer substrate 1210. The second semiconductor chip 1400 and the chip stack CS may be electrically connected to each other through a circuit line 1212 in the interposer substrate 1210. A third under-fill layer 1406 may be provided between the interposer substrate 1210 and the second semiconductor chip 1400. The third under-fill layer 1406 may surround the bumps 1404, while filling a space between the interposer substrate 1210 and the second semiconductor chip 1400.

A second molding layer 1500 may be provided on the interposer substrate 1210. The second molding layer 1500 may cover the top surface of the interposer substrate 1210. The second molding layer 1500 may surround the chip stack CS and the second semiconductor chip 1400. The second molding layer 1500 may have a top surface located at the same level as that of a top surface of the chip stack CS, and may be coplanar with the top surface of the chip stack CS. The second molding layer 1500 may include or be formed of a dielectric material. For example, the second molding layer 1500 may include an epoxy molding compound (EMC).

FIGS. 14 to 18 illustrate cross-sectional views showing a method of fabricating a semiconductor package according to some embodiments of the present inventive concepts.

Figure 14:
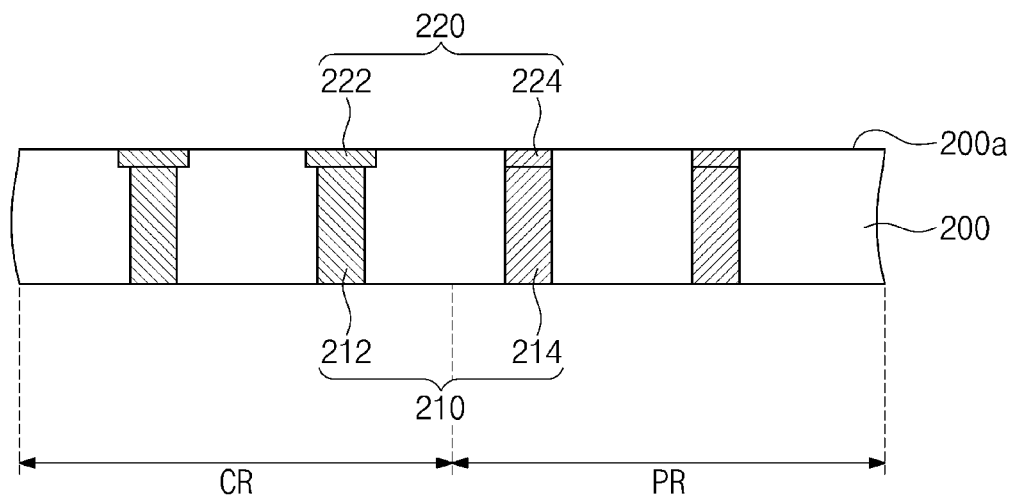
FIGS. 14 to 18 illustrate cross-sectional views showing a method of fabricating a semiconductor package according to some embodiments of the present inventive concepts.

Referring to FIG. 14, a second die 200 may be provided. The second die 200 may include a semiconductor material. For example, the second die 200 may be a silicon (Si) substrate, a germanium (Ge) substrate, or a silicon-germanium (SiGe) substrate. When viewed in plan view, the second die 200 may have a central region CR and a peripheral region PR that surrounds the central region CR.

A plurality of fourth vias 210 may be formed in the second die 200. The fourth vias 210 may be formed by forming a trench (not shown) in the second die 200, depositing a conductive material layer (not shown) to fill the trench, and planarizing or etching the conductive material layer to expose a top surface 200*a* of the second die 200. For example, the trench may be formed by a dry etching process or a wet etching process. The conductive material layer may be deposited by at least one selected from chemical vapor deposition (CVD), plasma enhanced chemical vapor deposition (PECVD), high density plasma chemical vapor deposition (HDPCVD), metal organic chemical vapor deposition (MOCVD), and atomic layer deposition (ALD). The fourth vias 210 may include or be formed of a conductive material. For example, the fourth vias 210 may include at least one selected from aluminum (Al), gold (Au), beryllium (Be), bismuth (Bi), cobalt (Co), copper (Cu), hafnium (Hf), indium (In), manganese (Mg), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The fourth vias 210 may include fifth vias 212 provided on the central region CR and sixth vias 214 provided on the peripheral region PR.

A plurality of fourth upper pads 220 may be formed on the fourth vias 210. For example, the fourth upper pads 220 may be formed by forming a metal layer (not shown) on the top surface 200*a* of the second die 200, and removing a portion of the metal layer. The formation of the metal layer may include performing at least one selected from chemical vapor deposition (CVD), physical vapor deposition (PVD), and atomic layer deposition (ALD). The partial removal of the metal layer may include using a patterning mask (not shown) to pattern the metal layer. Alternatively, the fourth upper pads 220 may be formed by forming a patterning mask (not shown), forming a metal layer on the patterning mask and the top surface 200*a* of the second die 200, and lifting off a portion of the metal layer positioned on the patterning mask. Afterwards, a dielectric layer may be formed on the top surface 200*a* of the second die 200, which dielectric layer surrounds the fourth upper pads 220. The fourth upper pads 220 may include or be formed of a conductive material. The fourth upper pads 220 may include copper (Cu), nickel (Ni), or an alloy thereof. The fourth upper pads 220 may be correspondingly formed on a plurality of fourth vias 210. For example, the fourth upper pads 220 may include fifth upper pads 222 provided on the central region CR and sixth upper pads 224 provided on the peripheral region PR. The fifth upper pads 222 may each have a width greater than that of each of the sixth upper pads 224.

Figure 15:
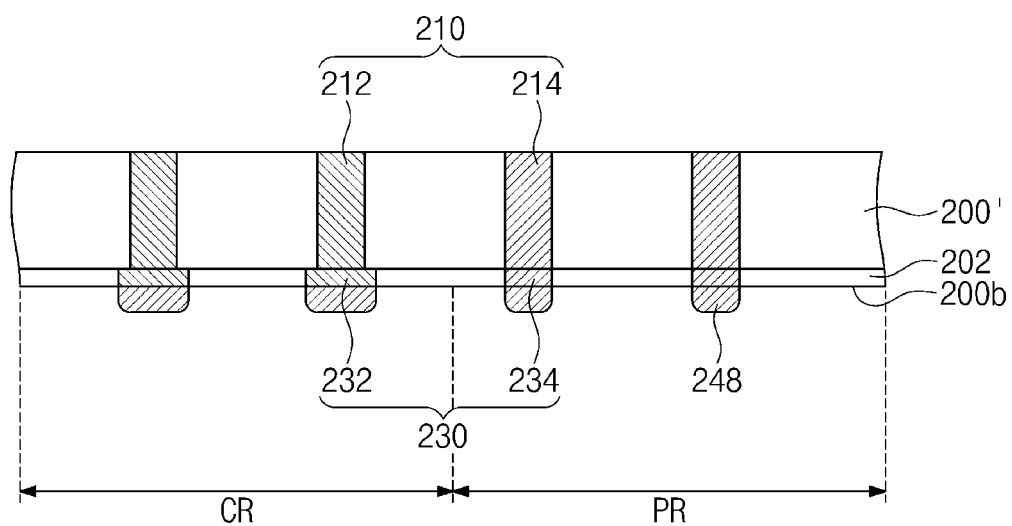

Referring to FIG. 15, another second die 200' may be provided. The other second die 200' may be the same as the second die 200 discussed with reference to FIG. 14 (e.g., have the same size, layout, and structure). For convenience of description, FIG. 14 depicts the formation of an upper portion of the second die 200, and FIG. 15 depicts the formation of a lower portion of the second die 200'. Substantially, the formation of an entire second die 200 or 200' may include all of a method of FIG. 14 and a method of FIG. 15.

A plurality of fourth vias 210 may be formed in the second die 200'. The fourth vias 210 may be formed by forming a trench (not shown) in the second die 200', depositing a conductive material layer (not shown) to fill the trench, and planarizing or etching the conductive material layer to expose a bottom surface 200*b* of the second die 200'. For example, the trench may be formed by a dry etching process or a wet etching process. The fourth vias 210 may include a conductive material. The fourth vias 210 may include fifth vias 212 provided on the central region CR and sixth vias 214 provided on the peripheral region PR.

A plurality of second lower pads 230 may be formed on the fourth vias 210. For example, the second lower pads 230 may be formed by forming a metal layer (not shown) on the bottom surface 200b of the second die 200', and removing a portion of the metal layer. The formation of the metal layer may include performing at least one selected from chemical vapor deposition (CVD), physical vapor deposition (PVD), and atomic layer deposition (ALD). The partial removal of the metal layer may include using a patterning mask (not shown) to pattern the metal layer. Alternatively, the second lower pads 230 may be formed by forming a patterning mask (not shown), forming a metal layer on the patterning mask and the bottom surface 200b of the second die 200', and lifting off a portion of the metal layer positioned on the patterning mask. The second lower pads 230 may include or be formed of a conductive material, such as discussed above in connection with the fourth upper pads 220. The second lower pads 230 may be correspondingly formed on a plurality of fourth vias 210. For example, the second lower pads 230 may include third lower pads 232 provided on the central region CR and fourth lower pads 234 provided on the peripheral region PR. The third lower pads 232 may each have a width greater than that of each of the fourth lower pads 234.

A solder material layer 248 may be provided on each of the second lower pads 230. The solder material layer 248 may be formed, for example, by using an electroplating process. For example, the solder material layer 248 may be formed by forming on the bottom surface 200b of the second die 200' a mask pattern that exposes the second lower pads 230, and performing a plating process in which the exposed second lower pads 230 are used as a seed. The solder material layer 248 may be formed of a solder material. For example, the solder material may include or be an alloy of tin (Sn) and silver (Ag).

Figure 16:
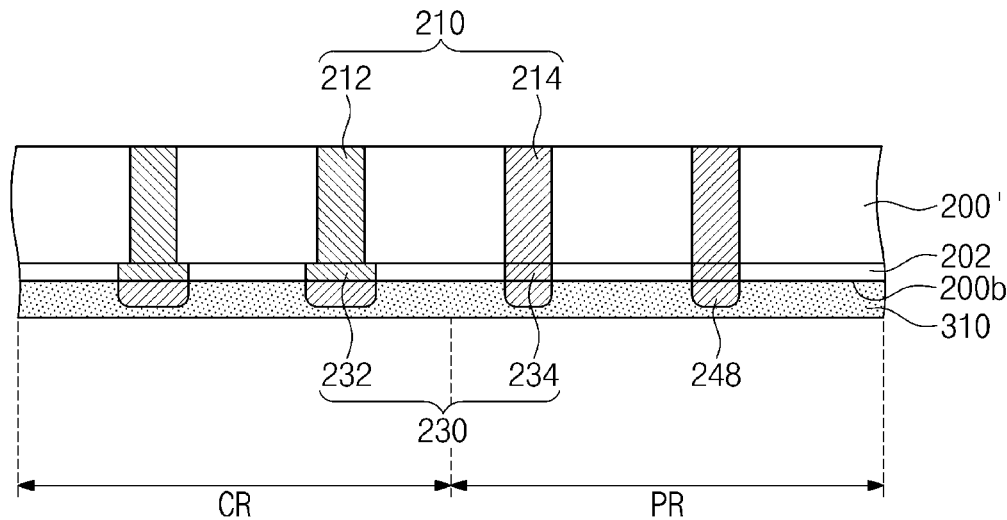

Referring to FIG. 16, a preliminary under-fill layer 310 may be provided on the bottom surface 200b of the second die 200', thereby covering the second lower pads 230 and the solder material layers 248. The preliminary under-fill layer 310 may protect the second lower pads 230, and the solder material layers 248, and the second die 200', and may connect the second die 200 to the other second die 200' in a process which will be discussed below. For example, the preliminary under-fill layer 310 may be one of a non-conductive film (NCF) and a non-conductive paste (NCP). In this case, a laminating process may be employed to form the NCF on the second die 200'. The preliminary under-fill layer 310 may include or be formed of a dielectric polymer. In one embodiment, bottom surface of the solder material layer 248 may be exposed on a bottom surface of the preliminary under-fill layer 310.

Figure 17:
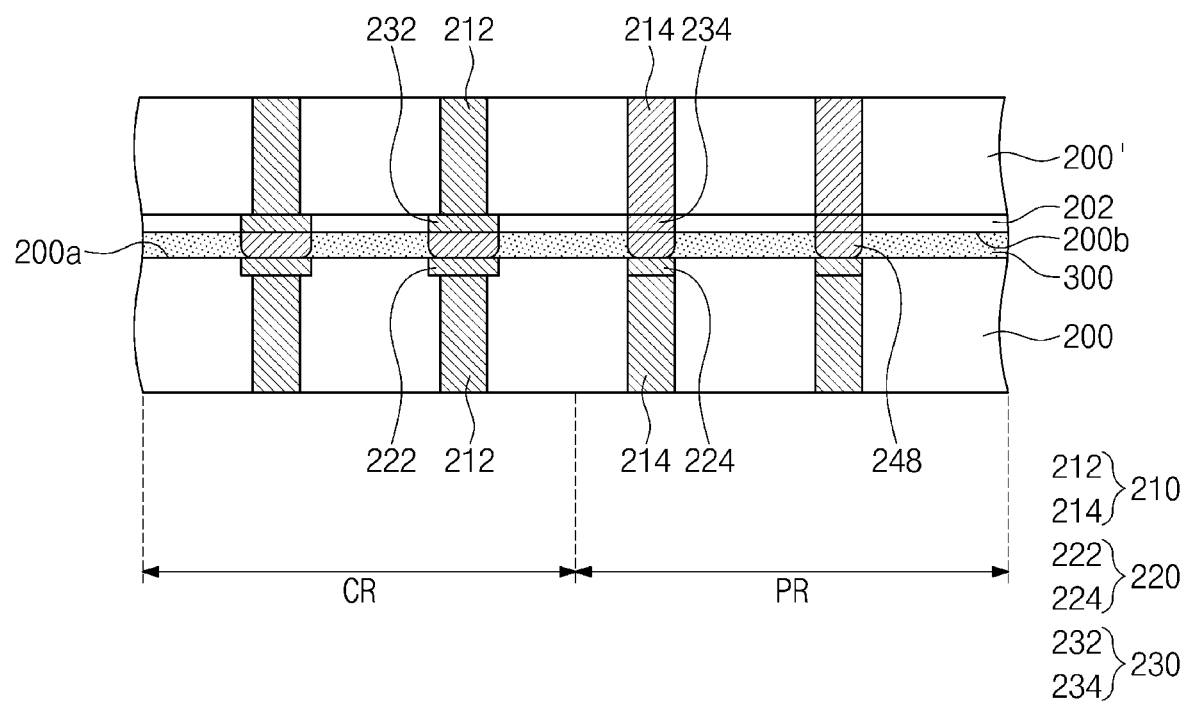

Referring to FIG. 17, the second dies 200 and 200' may be stacked. The second dies 200 and 200' may be disposed to allow the top surface 200a of the second die 200 to face the bottom surface 200b of the other second die 200'. The fourth upper pads 220 may be vertically aligned with the second lower pads 230. For example, the fifth upper pads 222 and the third lower pads 232 may be vertically aligned with each other on the central region CR, and the sixth upper pads 224 and the fourth lower pads 234 may be vertically aligned with each other on the peripheral region PR. The exposed bottom surface of the solder material layer 248 may be in contact with the fourth upper pad 220.

Figure 18:
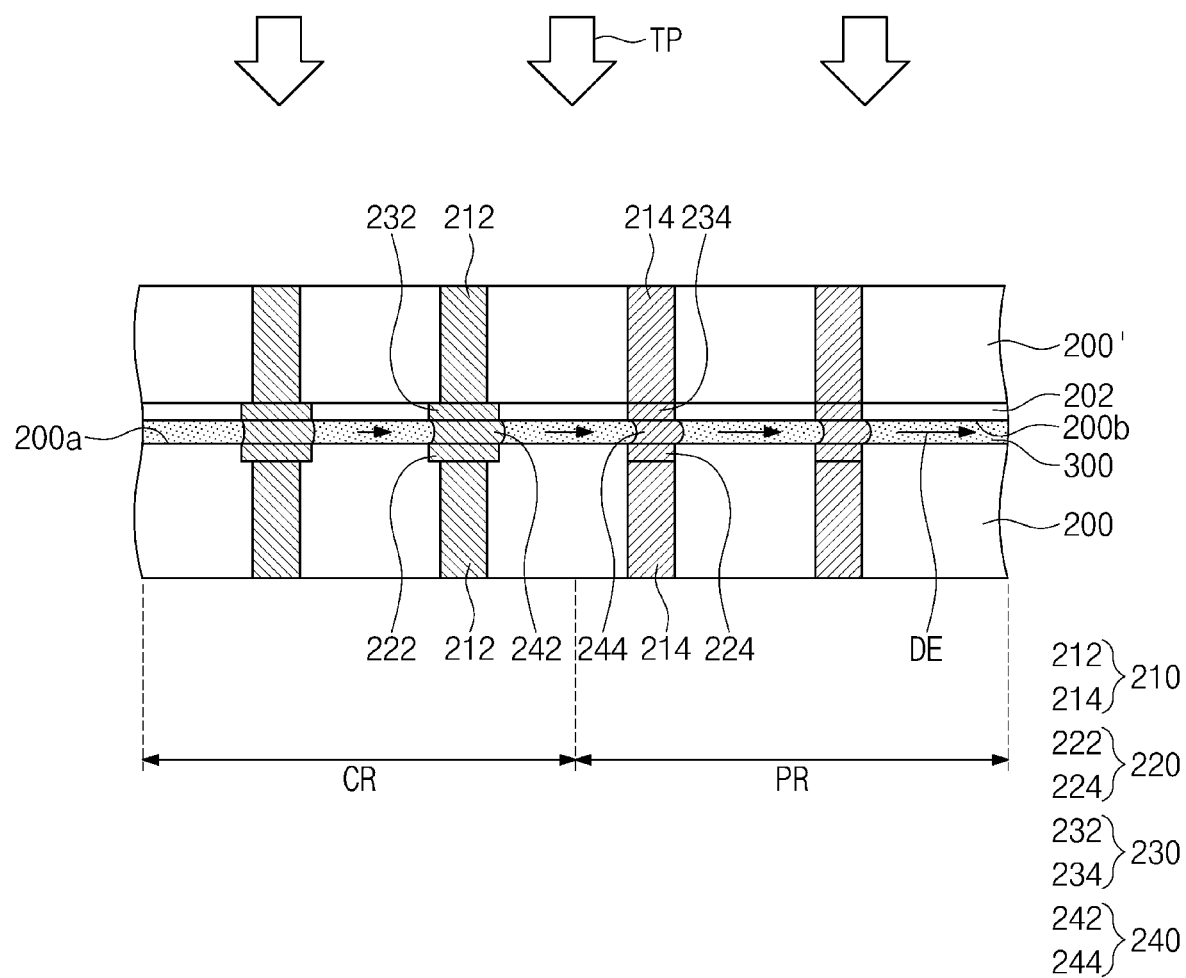

Referring to FIG. 18, a solder between dies may undergo a reflow process to bond the dies to each other. As illustrated in FIG. 18, the solder material layers 248 may be reflowed to form connection terminals 240. The reflow of the solder material layers 248 may be performed at a low temperature. For example, the solder material layers 248 may be reflowed at a temperature ranging from about 138° C. to about 180° C. When the solder material layer 248 is reflowed, the solder material layer 248 may be changed into a liquid state. A surface tension of a liquid solder may convert the solder material layer 248 into the connection terminal 240 that has a bead shape. The connection terminals 240 may connect the fourth upper pads 220 to the second lower pads 230.

For example, a thermocompression bonding process may be performed on the second dies 200 and 200'. For example, the upper second die 200' may be provided with a pressure TP directed toward an underlying second die 200, and simultaneously, heat may be applied to the second dies 200 and 200'. A temperature of the thermocompression bonding process may fall within a range of temperature at which the solder material layer 248 is melted and of temperature at which the preliminary under-fill layer 310 is softened. As the solder material layer 248 is provided with heat, the solder material layer 248 may be melted.

The solder material layer 248 may be liquefied which fills a space between the fourth upper pads 220 and the second lower pads 230 and the preliminary under-fill layer 310 is softened, and then the pressure TP of the thermocompression bonding process may cause the second dies 200 and 200' to become closer to each other. Therefore, a small interval may be provided between the second dies 200 and 200', and a compact semiconductor package may be fabricated. As a result, it may be possible to fabricate a semiconductor package with improved thermal stability.

The connection terminals 240 may be formed to have shapes that are changed based on position. As illustrated in FIG. 18, in the thermocompression bonding process, a softened preliminary dielectric layer De may have fluidity. For example, when viewed in plan view, the preliminary dielectric layer DE may flow in a direction outwardly from a center of the first die 100. The preliminary dielectric layer De may flow from the central region CR toward the peripheral region PR. In this case, the flow degree (e.g., flow rate), or displacement amount, of the preliminary dielectric layer DE may be greater on the peripheral region PR than on the central region CR. The moving preliminary dielectric layer DE may apply a pressure to the melted solder material layers 248, thereby changing shapes of the connection terminals 240. For example, a sweep distance, or displacement amount or distance, of the solder material layers 248 may be greater on the peripheral region PR than on the central region CR. In this description, the sweep distance may mean a length over which the solder material layer 248 is swept along (e.g., displaced) with flow of the preliminary dielectric layer DE from lateral surfaces of the fourth upper pad 220 and the second lower pad 230 that are in contact with the connection terminal 240. The sweep distances of the solder material layers 248 may increase in a direction toward lateral a surface of the second die 200 or 200'. In this manner, in some embodiments, connection terminals 240 include some material displaced outward from a center toward an outer edge of the second die 200 and second die 200' during manufacturing, which causes each connection terminal 240 to have both a concave lateral surface and a convex lateral surface, which may be opposite each other. In addition, the degree or distance of displacement of the material that forms the connection terminals 240 may gradually increase from connection terminals 240 closer to the center of the second dies 200 and 200' toward connection terminals 240 closer to outer edges of the second dies 200 and 200'.

According to some embodiments of the present inventive concepts, as the fourth upper pads 220 and the second lower pads 230 have small widths and large intervals on the peripheral region PR, neighboring connection terminals 240 may not contact each other even when the solder material layers 248 have large sweep distances.

In addition, as the solder material layers 248 have small sweep distances on the central region CR, the fourth upper pads 220 and the second lower pads 230 may be formed to have their large widths to permit easy heat transfer between the second dies 200 and 200'.

The melted solder material layers 248 may be cooled to form the connection terminals 240. In this case, the preliminary under-fill layer 310 may be hardened. At the same time when the connection terminals 240 are formed, the softened preliminary under-fill layer 310 may be hardened to form an under-fill layer 300. The under-fill layer 300 may surround the connection terminals 240, and may protect the connection terminals 240 against external impact and/or stress. In addition, as the connection terminals 240 and the under-fill layer 300 are formed simultaneously, the under-fill layer 300 may protect the connection terminals 240 from stress caused by warpage resulting from a temperature difference that can occur in the cooling process. Accordingly, it may be possible to fabricate a semiconductor package with improved structural stability and to reduce the occurrence of failure in fabricating the semiconductor package.

Referring back to FIG. 1, a first die 100 may be provided. The first die 100 may correspond to the first die 100 discussed with reference to FIGS. 1 to 12.

A plurality of second dies 200 may be stacked on the first die 100. The process of mounting the second die 200 on the first die 100 may be substantially the same as the process of mounting the other second die 200' on the second die 200, as discussed with reference to FIGS. 15 to 18.

Thereafter, a molding layer 400 may be formed on the first die 100.

A semiconductor package according to some embodiments of the present inventive concepts may be configured such that pads provided on a central region are formed to have large areas, and thus heat generated from a die may be easily discharged outwardly through the pads. As a result, the semiconductor package may be provided with improved efficiency of thermal radiation.

A large interval may be provided between the pads by allowing the pads to have small widths on a peripheral region where convex portions have their large heights. Therefore, there may be no occurrence of electrical short caused by contact between connection terminals on the peripheral region. Accordingly, the semiconductor package may have improved electrical stability.

Moreover, even when the pads are configured to have their large widths on the peripheral region where the convex portions have their small heights, intervals between the pads may not be small. Therefore, heat generated from the die may be easily discharged outwardly through the pads while preventing an electrical short between the connection terminals. Accordingly, the semiconductor package may be provided with increased efficiency of thermal radiation and improved operating stability.

Although the present inventive concepts have been described in connection with the some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
  a first die having a central region and a peripheral region that surrounds the central region;
  through electrodes that penetrate the first die;
  first pads at a top surface of the first die and coupled to the through electrodes;
  a second die on the first die;
  second pads at a bottom surface of the second die, the bottom surface of the second die facing the top surface of the first die;
  connection terminals that connect the first pads to the second pads; and
  a dielectric layer that fills a space between the first die and the second die and surrounds the connection terminals,
  wherein a first width of each of the first pads in the central region is greater than a second width of each of the first pads in the peripheral region,
  wherein each of the connection terminals includes a convex portion at a lateral surface thereof, which protrudes beyond a lateral surface of a respective first pad and a lateral surface of a respective second pad, the convex portion protruding in a direction away from a center of the first die, and
  wherein protruding distances of the convex portions increase in a direction from the center of the first die toward an outside of the first die.

2. The semiconductor package of claim 1, wherein the first width of each of the first pads on the central region is about 1.01 times to about 1.5 times the second width of each of the first pads on the peripheral region.

3. The semiconductor package of claim 1, wherein a first ratio of the first width in a first direction to an arrangement period of the first pads on the central region in the first direction is greater than a second ratio of the second width in the first direction to an arrangement period of the first pads on the peripheral region in the first direction.

4. The semiconductor package of claim 1, wherein an area of each of the first pads on the central region is greater than an area of each of the first pads on the peripheral region.

5. The semiconductor package of claim 1, wherein:
  each of the connection terminals includes a concave portion that is recessed from the lateral surface of a respective first pad and the lateral surface of a respective second pad,
  the convex portion is on a first side of the connection terminal, the first side being directed toward the outside of the first die, and
  the concave portion is a second side of the connection terminal, the second side being directed toward an inside of the first die.

6. The semiconductor package of claim 5, wherein recessed depths of the concave portions increase in a direction from the center of the first die toward the outside of the first die.

7. The semiconductor package of claim 1, further comprising:
  a substrate;
  a plurality of substrate terminals on a bottom surface of the first die and connecting the first die to the substrate; and a molding layer on the substrate and covering the first die and the second die.

8. A semiconductor package, comprising:
a first die;
a plurality of second dies stacked on the first die, each of the second dies including first pads, second pads, a plurality of third pads, and fourth pads, the first pads and the second pads being on a top surface of the respective second die, and the third pads and the fourth pads being on a bottom surface of the respective second die;
for each pair of adjacent second dies, first connection terminals, which connect the first pads of a lower second die of the pair of adjacent second dies to the third pads of an upper second die of the pair of adjacent second dies, the first pads and the third pads vertically overlapping each other between the pair of adjacent second dies;
for each pair of adjacent second dies, second connection terminals, which connect the second pads of a lower second die of the pair of adjacent second dies to the fourth pads of an upper second die of the pair of adjacent second dies, the second pads and the fourth pads vertically overlapping each other between the pair of adjacent second dies;
for each pair of adjacent second dies, a dielectric layer that fills a space between the pair of adjacent second dies; and
a plurality of external terminals below the first die and connecting the first die to a substrate,
wherein the first and third pads are in a central region of the second dies,
wherein the second and fourth pads are in a peripheral region of the second dies that is outside of the central region, and
wherein a first ratio of the maximum width of each first pad in a first horizontal direction to an arrangement period of the first pads in the first horizontal direction is greater than a second ratio of the maximum width of each second pad in the first horizontal direction to an arrangement period of the second pads in the first horizontal direction.

9. The semiconductor package of claim 8, wherein the maximum width of each first pad in the first horizontal direction and the maximum width of each third pad in the first horizontal direction are greater than each of the maximum width of each second pad in the first horizontal direction and the maximum width of each fourth pad in the first horizontal direction.

10. The semiconductor package of claim 9, wherein the maximum width of each first pad in the first horizontal direction and the maximum width of each third pad in the first horizontal direction are about 1.01 times to about 1.5 times the maximum width of each second pad in the first horizontal direction and the maximum width of each fourth pad in the first horizontal direction.

11. The semiconductor package of claim 8, wherein the arrangement period of the first pads is the same as the arrangement period of the second pads.

12. The semiconductor package of claim 8, wherein the first ratio is about 1.01 times to about 1.5 times the second ratio.

13. The semiconductor package of claim 8, wherein:
each of the first connection terminals includes a first convex portion that protrudes beyond lateral surfaces of respective first and third pads, the first convex portion being on one side of the first connection terminal, the one side of the first connection terminal being directed toward an outside of the first die,
each of the second connection terminals includes a second convex portion that protrudes beyond lateral surfaces of respective second and fourth pads, the second convex portion being on one side of the second connection terminal, the one side of the second connection terminal being directed toward the outside of the first die, and
the maximum protruding distance of each second convex portion in a direction perpendicular to the lateral surfaces of respective second and fourth pads is greater than a protruding distance of each first convex portion in a direction perpendicular to the lateral surfaces of respective first and third pads.

14. The semiconductor package of claim 13, wherein:
each first convex portion is spaced apart from an adjacent first connection terminal, and
each second convex portion is spaced apart from an adjacent second connection terminal.

15. The semiconductor package of claim 8, wherein:
each of the first connection terminals includes a first concave portion that is recessed from lateral surfaces of the first and third pads, the first concave portion being on a first side of the first connection terminal, the first side of the first connection terminal being directed toward an inside of the first die,
each of the second connection terminals includes a second concave portion that is recessed from lateral surfaces of the second and fourth pads, the second concave portion being on a first side of the second connection terminal, the first side of the second connection terminal being directed toward the inside of the first die, and
a recessed depth of each second concave portion is greater than a recessed depth of each first concave portion.

16. A semiconductor package, comprising:
a substrate;
a plurality of dies stacked on the substrate, each die of the plurality of dies including first pads on a top surface of the die and second pads on a bottom surface of the die;
connection terminals that connect the first pads to the second pads; and
a dielectric layer that fills a space between the dies and surrounds the connection terminals,
wherein the dies have a central region and a peripheral region that surrounds the central region,
wherein a first area of each of the first pads in the central region is greater than a second area of each of the first pads in the peripheral region, and
wherein each of the connection terminals includes a convex portion on one side of the connection terminal and no convex portion on a second, opposite side of the connection terminal, the one side being directed toward an outside of the die.

17. The semiconductor package of claim 16, wherein the maximum width in a first direction of each of the first pads in the central region is greater than the maximum width in the first direction of each of the first pads in the peripheral region.

18. The semiconductor package of claim 17, wherein the maximum width in the first direction of each of the first pads in the central region is about 1.01 times to about 1.5 times the maximum width in the first direction of each of the first pads in the peripheral region.

19. The semiconductor package of claim 16, wherein a first ratio of the maximum width in a first direction of each of the first pads on the central region to an arrangement period in the first direction of the first pads on the central region is greater than a second ratio of the maximum width in the first direction of each of the first pads on the peripheral region to an arrangement period in the first direction of the first pads on the peripheral region.

20. The semiconductor package of claim 16, wherein protruding distances of the convex portions increase in a direction from a center of the dies toward an outside of the dies.

* * * * *

UNITED STATES PATENT AND TRADEMARK OFFICE
CERTIFICATE OF CORRECTION

| | | |
|---|---|---|
| PATENT NO. | : 12,469,810 B2 | Page 1 of 1 |
| APPLICATION NO. | : 17/939127 | |
| DATED | : November 11, 2025 | |
| INVENTOR(S) | : Seongyo Kim et al. | |

It is certified that error appears in the above-identified patent and that said Letters Patent is hereby corrected as shown below:

On the Title Page

Please add item (30) the foreign application priority date:
Jan. 14, 2022 (KR) ..................... 10-2022-0006089

Signed and Sealed this
Twenty-third Day of December, 2025

John A. Squires
*Director of the United States Patent and Trademark Office*